(12) United States Patent
Marbella et al.

(10) Patent No.: US 9,082,737 B2
(45) Date of Patent: Jul. 14, 2015

(54) SYSTEM AND METHOD FOR AN ELECTRONIC PACKAGE WITH A FAIL-OPEN MECHANISM

(71) Applicant: Infineon Technologies AG, Neubiberg (DE)

(72) Inventors: Carlo Baterna Marbella, Singapore (SG); Ganesh Vetrivel Periasamy, Singapore (SG); Woon Yik Yong, Singapore (SG); Kok Kiat Koo, Singapore (SG); Christian Arndt, Munich (DE); Edward Myers, Munich (DE)

(73) Assignee: Infineon Technologies AG, Neubiberg (DE)

( * ) Notice: Subject to any disclaimer, the term of this patent is extended or adjusted under 35 U.S.C. 154(b) by 177 days.

(21) Appl. No.: 13/678,421

(22) Filed: Nov. 15, 2012

(65) Prior Publication Data

US 2014/0131844 A1    May 15, 2014

(51) Int. Cl.
*H01L 23/34* (2006.01)
*H01L 23/495* (2006.01)
*H01L 25/16* (2006.01)
*H01L 23/31* (2006.01)

(52) U.S. Cl.
CPC .............. *H01L 23/34* (2013.01); *H01L 23/495* (2013.01); *H01L 23/49555* (2013.01); *H01L 25/16* (2013.01); *H01L 23/3107* (2013.01); *H01L 2924/0002* (2013.01)

(58) Field of Classification Search
USPC ............. 257/727, 666, E23.08; 361/103–106
See application file for complete search history.

(56) References Cited

U.S. PATENT DOCUMENTS

| | | | |
|---|---|---|---|
| 4,635,091 A | | 1/1987 | Roger |
| 5,663,861 A | * | 9/1997 | Reddy et al. ................... 361/106 |
| 6,255,141 B1 | | 7/2001 | Singh et al. |
| 6,327,128 B1 | * | 12/2001 | De Petris ....................... 361/103 |
| 7,999,363 B2 | * | 8/2011 | Hebert et al. .................. 257/666 |
| 8,767,368 B2 | * | 7/2014 | Yoneda .......................... 361/104 |
| 2002/0041476 A1 | * | 4/2002 | Petris ............................. 361/103 |
| 2006/0215342 A1 | * | 9/2006 | Montoya et al. ................ 361/103 |
| 2008/0180871 A1 | * | 7/2008 | Hebert et al. .................. 361/106 |
| 2010/0245022 A1 | * | 9/2010 | Galla et al. ..................... 337/159 |
| 2013/0194752 A1 | | 8/2013 | Marbella et al. |

OTHER PUBLICATIONS

Schneider-Ramelow, et al., "Sicherer Kfz-Body-Leistungshalbleiter" (Safe Automotive Body-power semiconductor), Infineon Technologies AG, Jan. 31, 2005, pp. 1-46.

* cited by examiner

*Primary Examiner* — Nitin Parekh
(74) *Attorney, Agent, or Firm* — Slater & Matsil, L.L.P.

(57) ABSTRACT

A semiconductor package including a fail open mechanism is disclosed. An embodiment includes a semiconductor package having a chip carrier, a chip disposed on the chip carrier and an encapsulant encapsulating the chip and the chip carrier. The semiconductor package further including a pin protruding from the encapsulant and a fail open mechanism disposed on the encapsulant and connected to the pin, wherein the fail open mechanism is configured to be disconnected from the pin if a temperature exceeds a pre-determined temperature.

24 Claims, 24 Drawing Sheets

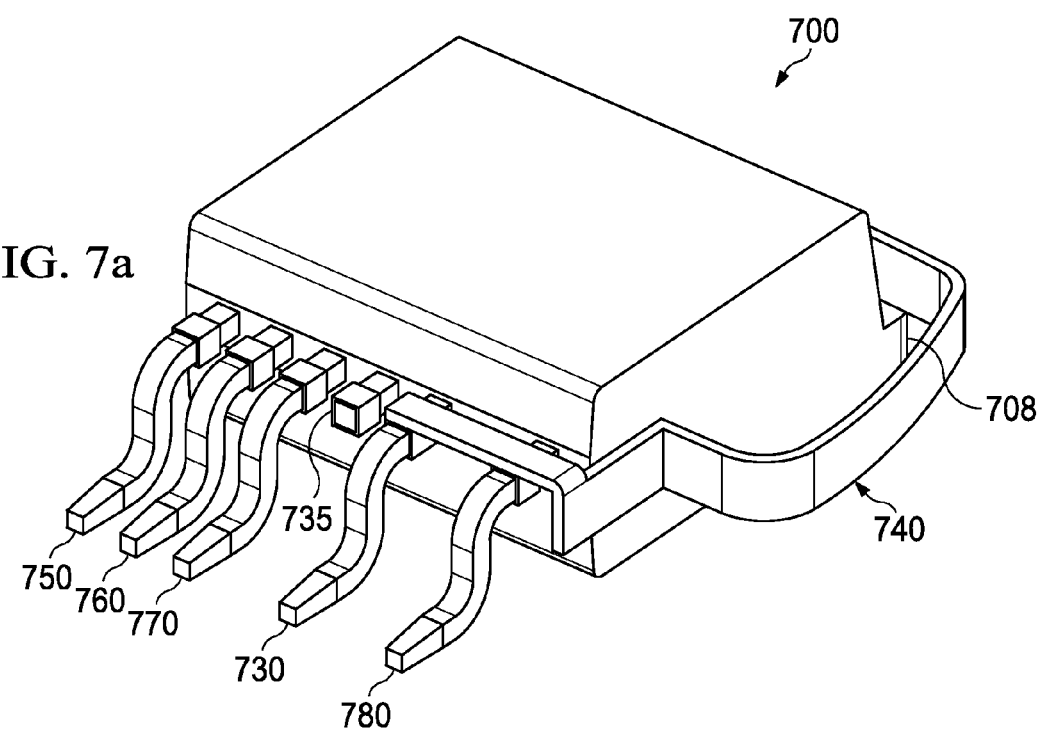
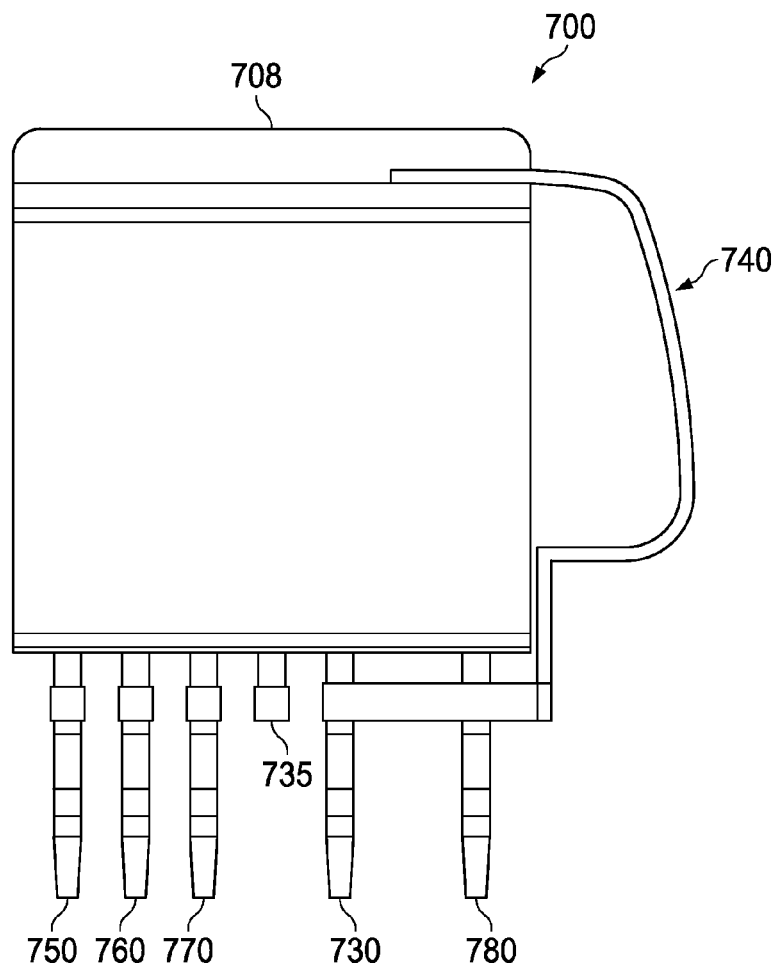

SYSTEM AND METHOD FOR AN ELECTRONIC PACKAGE WITH A FAIL-OPEN MECHANISM

TECHNICAL FIELD

An embodiment of the present invention relates generally to an electronic component package and more particularly to a system and a method for an electronic package with a fail-open mechanism.

BACKGROUND

Power semiconductor devices such as power Metal-Oxide Semiconductor Field-Effect Transistor (MOSFET) devices have become ubiquitous in a wide range of applications, from industrial applications such as heavy machinery, to consumer applications such as Heating, Ventilation, & Air Conditioning (HVAC) systems, electrical distribution systems and automotive systems. Power semiconductor devices are useful in that they can replace mechanical switches and relays with a fully solid-state device having a small form factor. In some situations, however, power semiconductor devices may pose a safety hazard due to device failure. For example, a power MOSFET device may fail in a short-circuit condition due to dielectric breakdown or metallization shorts that results in a low ohmic state. In this low ohmic state, control over the gate of the MOSFET is lost for a prolonged duration resulting in localized resistive heating of the device, which may create a hot spot within the device. Over time, this heating may lead to an undesirable thermal ignition of the package of the MOSFET device, the printed circuit board (PCB) on which the device is mounted, and/or the system in which the device installed.

Thermal ignition of power semiconductor devices is particularly dangerous in systems in which safety is a primary concern, such as in an automobile. If localized heating in a power semiconductor causes thermal ignition, the package ignites, which, in turn, ignites the PCB on which the package is mounted. The burning PCB may then set the automobile on fire.

Detecting the onset of a thermal overload condition is challenging because the onset of thermal overload is not necessarily accompanied by an easily detectable high current condition. If local heating within a particular device is caused by current crowding in a small region of the devices semiconductor material, high temperatures may be achieved within the device without appreciable current. Controlling or stopping the thermal overload condition may also be difficult if the device fails in a short-circuit condition that leaves the device uncontrollable. Some systems, have addressed this issue by coupling reflowable a thermal protection device (RTP) in series with the gate of the power semiconductor device that is designed to create an open circuit when the temperature of the RTP device exceeds a critical temperature.

SUMMARY OF THE INVENTION

In accordance with an embodiment of the present invention, a semiconductor package comprises a chip carrier, a chip disposed on the chip carrier and an encapsulant encapsulating the chip and the chip carrier. The semiconductor package further comprising a pin protruding from the encapsulant and a fail open mechanism disposed on the encapsulant and connected to the pin, wherein the fail open mechanism is configured to be disconnected from the pin if a temperature exceeds a pre-determined temperature.

In accordance with an embodiment of the present invention, a system comprises a printed circuit board comprising a contact and a packaged chip disposed on the printed circuit board, the packaged chip comprising an encapsulant and a fail open mechanism disposed on the encapsulant, wherein the fail open mechanism is connected to the contact, and wherein the fail open mechanism is configured to disconnect from the contact if a pre-determined temperature is exceeded.

In accordance with another embodiment of the present invention, a device comprises a semiconductor package having a chip carrier, a chip disposed on the chip carrier and an encapsulant encapsulating the chip and the chip carrier. The semiconductor package further comprises a hole in the chip carrier and a fail open mechanism disposed in the hole, wherein the fail open mechanism is configured to open if a temperature exceeds a pre-determined temperature.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7a-7d illustrate another embodiment of a package with a releasable contact in closed and open position;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a system and a method for an electronic package of a power semiconductor device with a fail-open mechanism. Embodiment systems and methods may also be applied to other types of electronic components that are prone to thermal overload or overheating.

Figure 1A:
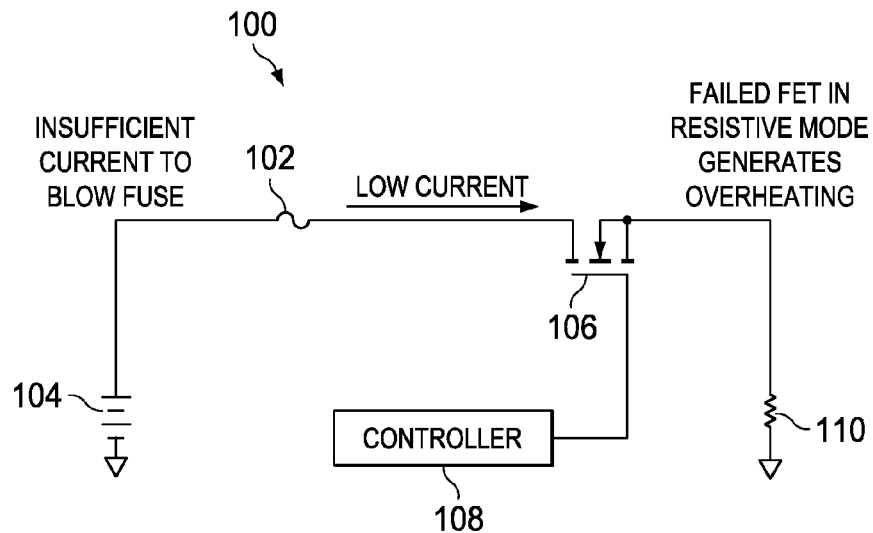
FIGS. 1a-1b illustrate an example automotive battery switch system.

FIG. 1a illustrates the issue of overheating in power semiconductor devices using automotive battery switch system 100 as an example. Automotive battery switch system 100 supplies power from battery 104 to load resistance 110 via fuse 102 and power transistor 106. Control integrated circuit 108 controls the gate of power transistor 106. Under normal operating conditions, control integrated circuit 108 may activate power transistor 106, once the ignition switch is activated by a driver. When power transistor 106 is turned on, current flows from battery 106 through load resistance 110. A typical automotive system may have a dozen or so power transistor switches that control the power to various systems of the automobile. For example, systems such as the wiper motor, interior lighting, the car's audio system, and other systems may each have a dedicated switch that supplies power to that particular system.

During normal operation, power transistor 106, which may be implemented as an n-channel MOSFET, has a low drain-source resistance. Power transistor 106 may operate under a wide range of voltages and frequencies, and may even have additional circuitry within the package of the power transistor that provides electrostatic discharge (ESD) protection and high temperature protection during normal operating conditions. However, in an end-of-life scenario for power transistor 106, dielectric breakdown or metallization shorts may occur, resulting in power transistor 106 being placed in a low ohmic state. In some situations, a source-drain short-circuit results, leaving power transistor 106 unable to be controlled via its gate terminal, resulting in resistive heating and a localized hotspot that may lead to thermal ignition of the package, the PCB, or the system in which the PCB and package are disposed.

Because heat is generated within localized hot spots within the power transistor 106, thermal ignition of power transistor 106 may result in low current failure conditions. In other words, high temperatures may result from currents that are less than the trip point of the fuse 102. If power transistor 106 fails in a low ohmic condition, a severe electrical overload may ignite the device.

In an embodiment, thermal ignition of a component package is avoided by using a fail open mechanism (or releasable contact). In one embodiment the component package comprises a releasable contact mechanism acting as a temperature fail safe mechanism. For example, the fail open mechanism (or releasable contact) is held in a stressed condition by a connection material such as a solder material. In one embodiment the circuit is opened by releasing the releasable contact (e.g., relaxation, spring) after the connection material softens or melts due to abnormal temperature rise because of component failure.

In one embodiment the releasable contact is electrically connected to a pin of the component package and/or to a pad of a component carrier such as a printed circuit board. Alternatively, the releasable contact is electrically connected to a pin and at least one lead of the component package.

In one embodiment the releasable contact is released from the pin, lead and/or pad above a predetermined temperature. In one embodiment an open circuit is formed when the component reaches a temperature of more than about 260° C., more than about 280° C., or more than about 300° C. Alternatively, the circuit is opened when the component reaches a temperature between about 260° C. to about 300° C.

In one embodiment an open circuit is formed when the component reaches a temperature between about 180° C. and about 240° C. Alternatively, the circuit is opened when the component reaches a temperature between about 200° C. and about 240° C.

In one embodiment the releasable contact is soldered to the pin, lead and/or pad with a solder material. In one embodiment the solder material becomes molten or liquid at a pre-determined temperature thereby releasing the releasable contact. The pre-determined temperature may be a higher temperature than the temperature of the solder material used to solder the component package to a carrier.

In one embodiment the releasable contact is mechanically connected or hooked (and not electrically connected) at a first side of the package and electrically connected to the pin and/or lead at a second side of the package. The releasable contact may be guided over a top surface of the package or along side surfaces of the package.

In an embodiment, a short circuit condition is terminated by physically severing the electrical connection between a pin and a lead, and/or a pad and a lead. For example, when the pre-determined temperature is reached, the component package (e.g., a surface mounted IC package) which is disposed on and electrically connected to the component carrier such as a printed circuit board, is electrically disconnected from the printed circuit board by cutting or opening an electrical path between the IC package and the printed circuit board above a certain temperature.

Figure 1B:
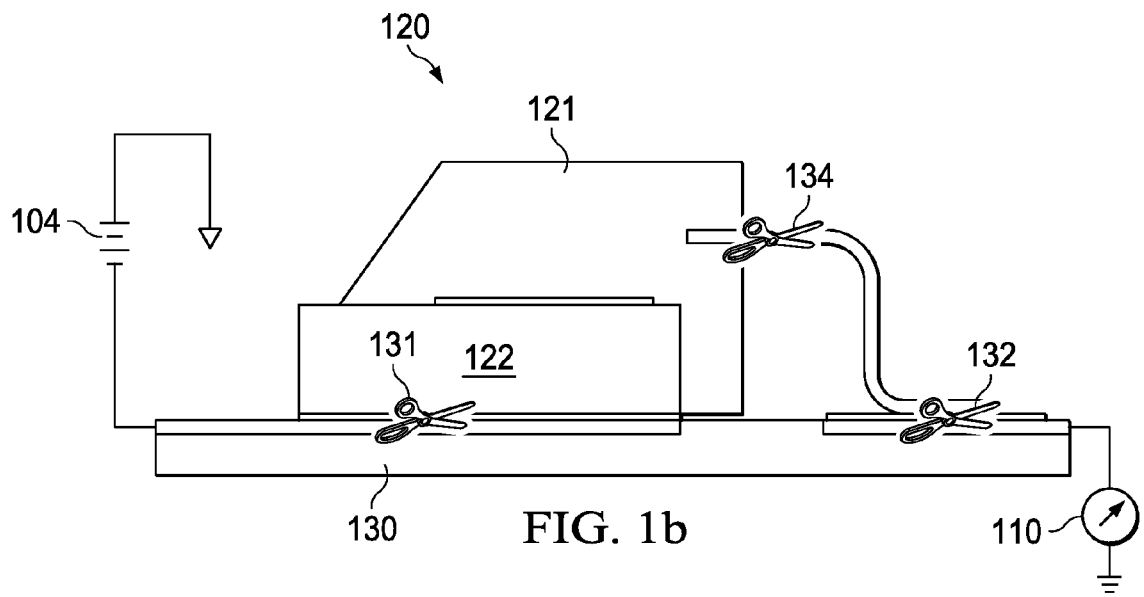

FIG. 1b shows a system 120 with an embodiment of a packaged component 120. Here, the packaged component 120 is placed on a printed circuit board for example. FIG. 1b shows the places where the packaged component 120 can be separated from the printed circuit board 130. In particular, the packaged component 120 may be severed from the printed circuit board 130 at 131, 132 and/or 134.

Figure 2A:
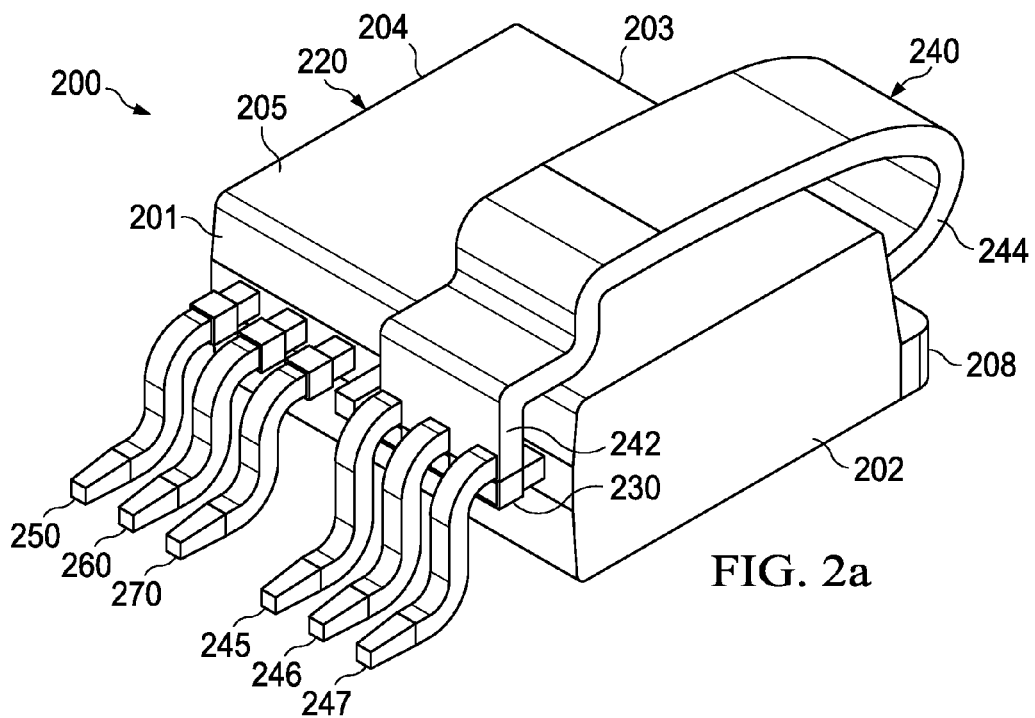
FIGS. 2a and 2d illustrate projection views of an embodiment of a package with a releasable contact.
Figure 2B:
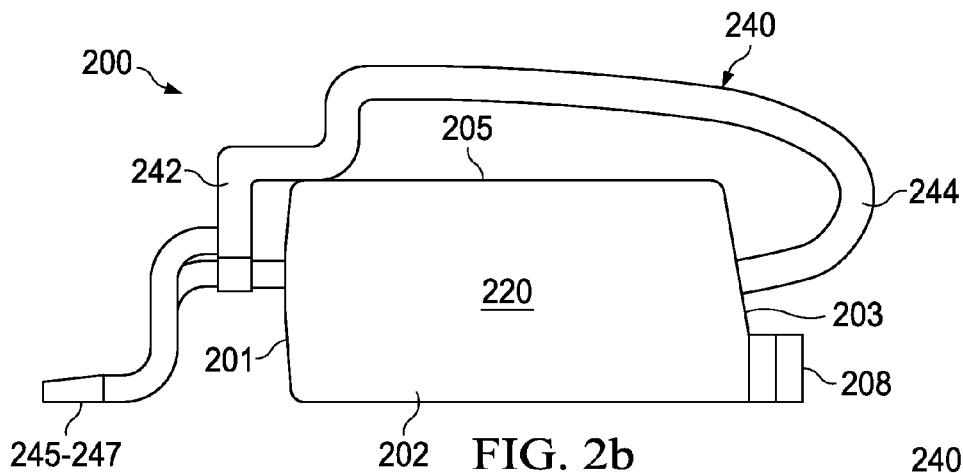
FIGS. 2b and 2e illustrate side views of an embodiment of the package with the releasable contact.
Figure 2C:
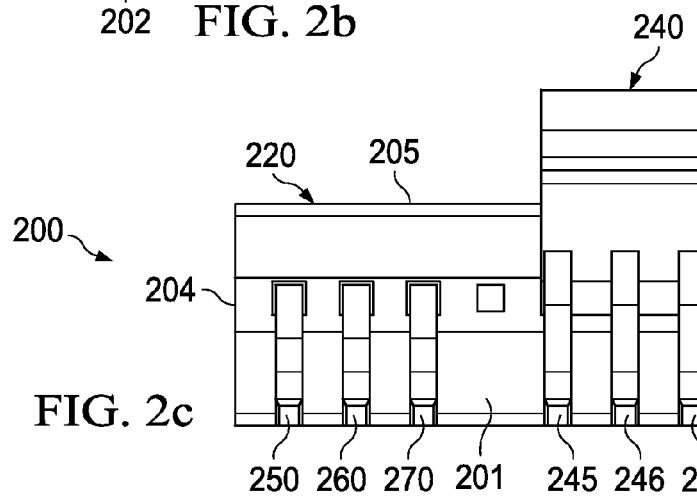
FIGS. 2c and 2f illustrate front views of an embodiment of the package with the releasable contact.
Figure 2D:
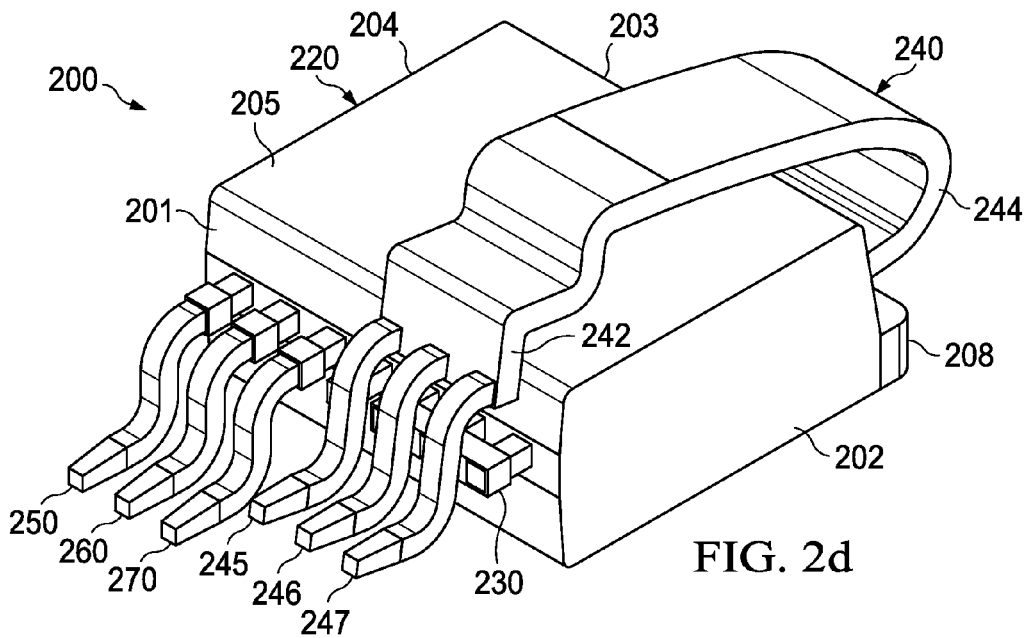
Figure 2E:
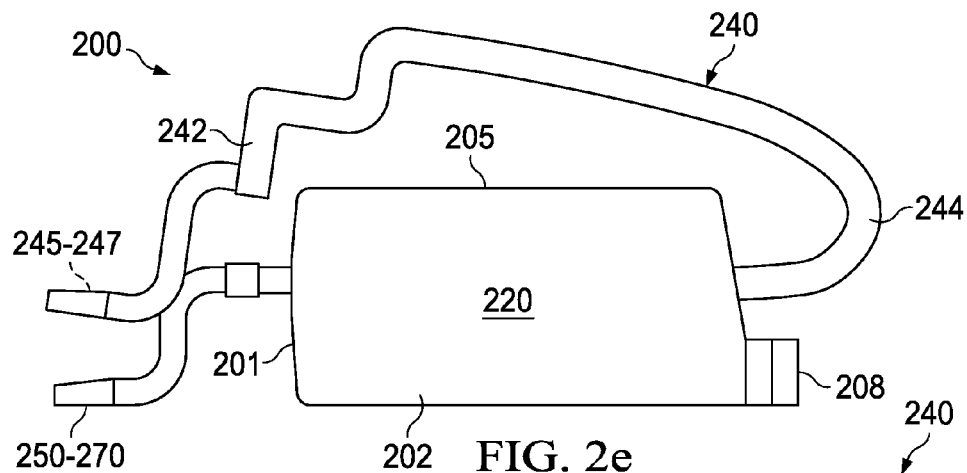
Figure 2F:
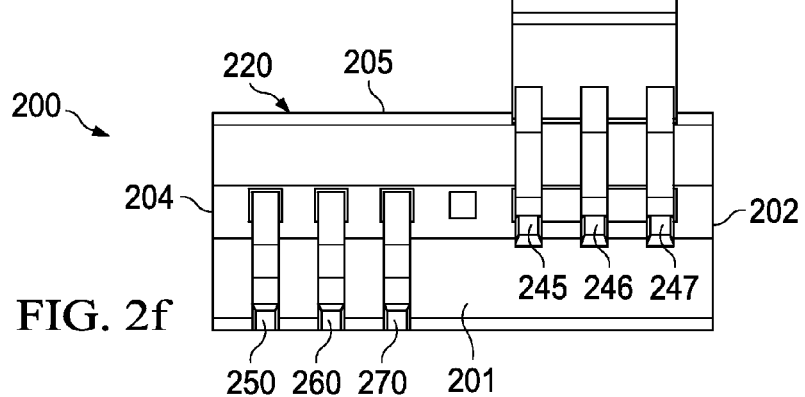

FIGS. 2a-2f show a first embodiment of a package 200. FIGS. 2a-2c show the component package 200 with a releasable contact 240 in closed position and FIGS. 2d-2f show the component package 200 with the releasable contact 240 in an open position.

The component package 200 comprises at least one component such as a chip (or die) inside the component package 200 (not shown). The component may be a discrete device such as a single semiconductor device or an integrated circuit (IC). For example, the component may be a MOSFET, a power semiconductor device such as a bipolar transistor, an insulated gate bipolar transistor (IGBT) or a power MOSFET, a thyristor, or a diode. Alternatively the component is a passive device such as a resistor, a capacitor, a MEMS device, an optoelectronic component, or a device of other functionality. The component may be a system on chip (SoC).

The component is disposed on a component carrier such as a lead frame or a substrate. The component may be attached to the component carrier through a die attach. The die attach may be conductive or non-conductive. The die attach may be a conductive thermal die attach comprising soft solder having lead or lead free compositions, or (conductive or insulating) epoxy die attach paste. Alternatively, the component is attached to the chip carrier through diffusion soldering.

In one embodiment the component is a power MOSFET transistor having a source contact on the top surface and a drain contact on the bottom surface. The drain contact is directly connected to the leadframe and the source contact is connected to leads via wire bond. Alternatively, the source contact is directly connected to the leadframe and the drain contact is connected to the leads via wire bond.

In one embodiment the component package 200 comprises two components. For example, the component package 200 comprises a power semiconductor chip and a control chip wherein the control chip controls the power semiconductor chip. The control chip may be disposed on the power semiconductor chip.

The component package 200 comprises an encapsulant 220. The encapsulant 220 may be a molding compound, a laminate or a casing. The encapsulant 220 may partially encapsulate the component carrier and completely encapsulate the component. The encapsulant 220 may completely or partially encapsulate the wires and/or the conductive clips.

The encapsulant 220 may comprise thermosetting materials such as an epoxy, polyimide, polyurethane or polyacrylate compound. Alternatively the encapsulant 220 may comprise thermoplastic materials such as polysulfones, polyphenylen sulfides, or polyetherimides. In one embodiment the encapsulation material may be a laminate such as a prepreg.

The component package 200 comprises side surfaces 201-204. The component package further comprises a top surface 205, leads 250-270, an I/O contact 208 and a pin 230. The leads 250-270 and the pin 230 are disposed on the first side surface 201 of the package 200. The leads 250-270 and the pin 230 are protruding out from the encapsulant 220. The pin 230, the leads 250-270 and the I/O contact 208 may comprise a metal such as copper.

In one embodiment the power semiconductor chip is connected with its first source/drain to the I/O contact 208 and with its second source/drain to the pin 230. The control chip is connected to the leads 250-270 and to the gate contact of the power semiconductor chip.

The component package 200 further comprises a releasable contact 240. The releasable contact 240 comprises a first portion 242 disposed on a first side surface 201 of the component package 200 and a second portion 244 disposed on a third side surface 203 of the component package 200. The releasable contact 240 may be disposed, arranged or guided over the top surface 205 of the component package 200. The releasable contact 240 may over-bridge the top surface 205 of the component package 200. The releasable contact 240 may comprise leads 245-247. The first portion 242 is electrically and mechanically connected through a connection material to the pin 230. The leads 245-247 and 250-270 are configured to be connected to a carrier such as a printed circuit board (not shown).

The releasable contact 240 is configured to be released, opened, or disconnected from the pin 230 under certain thermal conditions. The releasable contact 240 may be a pre-stressed strip, a pre-stressed metal, a compressed metal strip or a metal spring. Alternatively, the releasable contact 240 may be a bended material. For example, the releasable contact 240 may comprise a metal, a plastic or a combination of metal and plastic. In one particular example, the releasable contact 240 is a copper spring. When released, the leads 245-247 of the releasable contact 240 may flip up or away from the encapsulant 220.

The releasable contact 240 is connected to the pin 230 by a connection material. In one embodiment the connection material is configured to release the releasable contact 240 from the pin 230 above a predetermined temperature. In one embodiment, the connection material is a solder material. Alternatively, the connection material is any other thermal sensitive material which can release the releasable contact 240 at a predetermined temperature.

In one embodiment, the solder material becomes molten at a temperature which is higher than the temperature for the solder material used for soldering the packaged chip to a carrier. In one embodiment the connection material becomes molten and releases the releasable contact 240 from the pin 230 at a temperature of about more than 260° C. or at a temperature of about more than 280° C. Alternatively, the connection material becomes molten or liquid between a temperature of about 260° C. and about 280° C., or between a temperature of about 260° C. and about 300° C. Moreover, the releasable contact 240 is released between a temperature of about 280° C. and about 300° C.

The connection material may comprises copper (Cu)/tin (Sn) alloy. Alternatively, the connection material comprises other alloys such as gold (Au)/tin or silver (Ag)/tin.

In one embodiment, the solder material becomes molten at a temperature which is lower than the temperature for the solder material used for soldering the packaged chip to a carrier. For example, if the component package 200 is assembled in a post-board assembly the connection material becomes molten and releases the releasable contact 240 from the pin 230 at a temperature between about 180° C. to about 200° C. Alternatively, the connection material becomes molten or liquid between a temperature of about 200° C. and about 240° C.

The connection material may comprises copper (Cu)/tin (Sn) alloy. Alternatively, the connection material comprises other alloys such as gold (Au)/tin or silver (Ag)/tin. The connection material for releasing the releasable contact 240 at below 240° C. is different than the connection material for releasing the releasable contact 240 above 260° C.

The component package 200 with the releasable contact 240 is disposed on a carrier such as a printed circuit board (PCB). Under a high temperature short-circuit condition, the component heats up component package 200 and activates the thermally releasable connection material. When this happens, thermally releasable connection material releases releasable contact 240, as illustrated in FIG. 2b. For example, the temperature at which the releasable contact (e.g., the leads 245-247) is disconnected or decoupled from the carrier (e.g., board) is above the melting point of the releasable connection material (e.g., 260° C.). It should be appreciated that in alternative embodiments the releasable contact 240 is be configured to be released at temperatures that are less than 260° C., and may vary according to the particular embodiment and the specification.

Figure 3A:
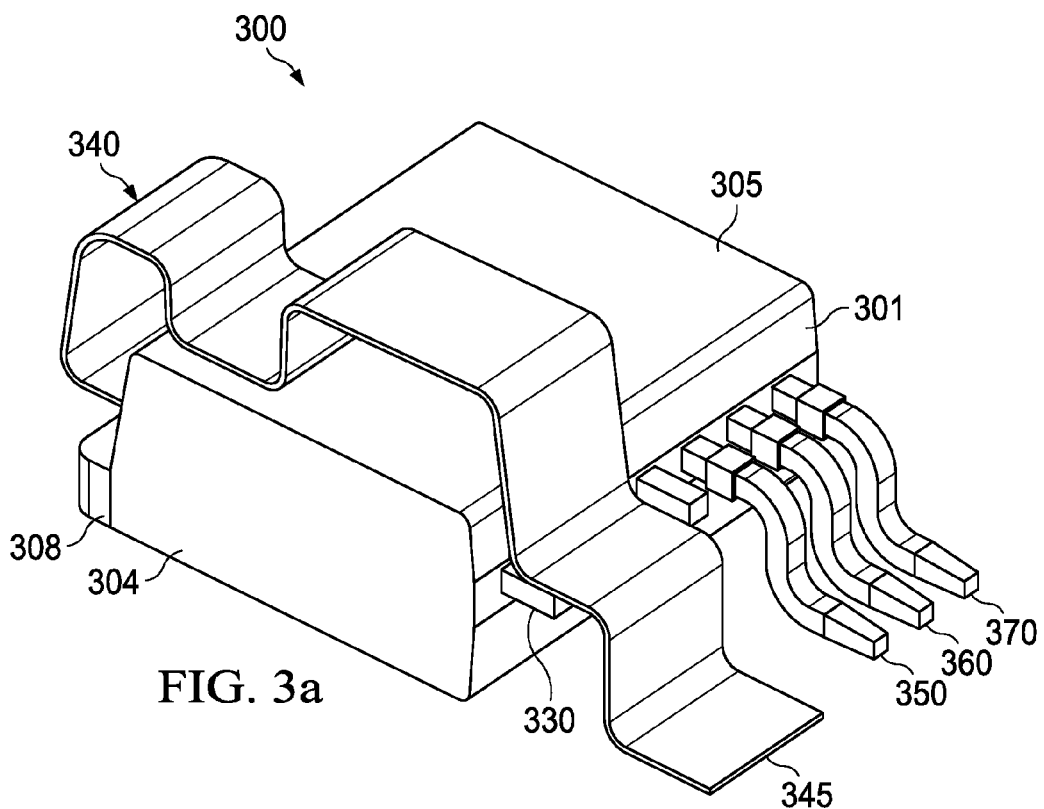
FIGS. 3a and 3b illustrate another embodiment of a package with a releasable contact in closed and open position.
Figure 3B:
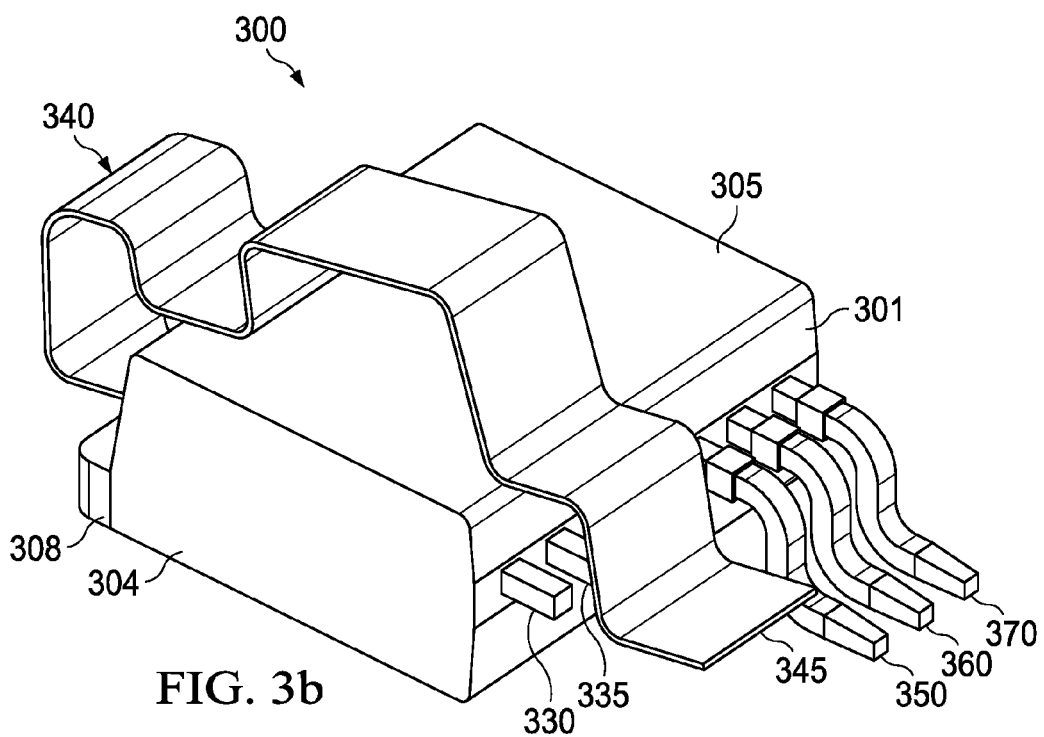

FIGS. 3a and 3b show an embodiment of a component package 300. FIG. 3a shows the component package 300 with a closed releasable contact 340 and FIG. 3b shows the component package 300 with the open releasable contact 340. The elements of the component package 300 are the same or similar as the elements of the component package 200, except of those described further below.

In this embodiment, the component package 300 comprises leads 350-370, and a releasable contact 340 having a single lead 345. The component package 300 may comprise one pin 330 or a plurality of pins such as two pins 330, 335, on which the releasable contact 340 with the single lead 345 is disposed in the closed position. The embodiment of the package 300 may comprise any other combination of pins 330/335 versus leads 345, 350-370. For example, the component package 300 may comprise two leads 350 and 370 and a releasable contact 340 with one lead 345.

Figure 4A:
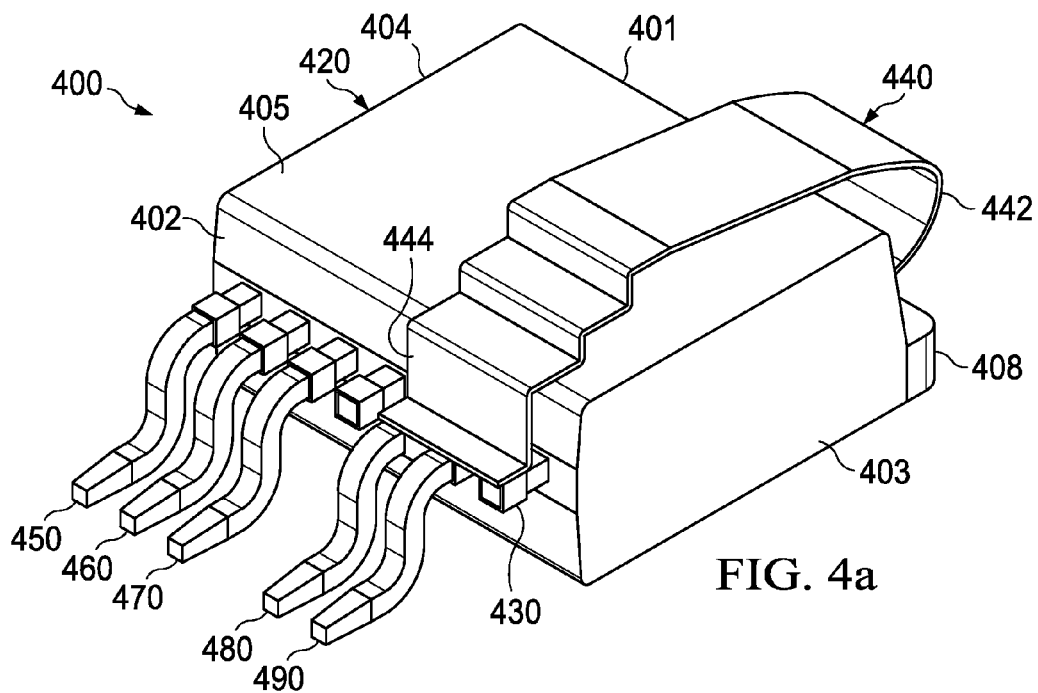
FIGS. 4a and 4d illustrate projection views of an embodiment of a package with a releasable contact.
Figure 4B:
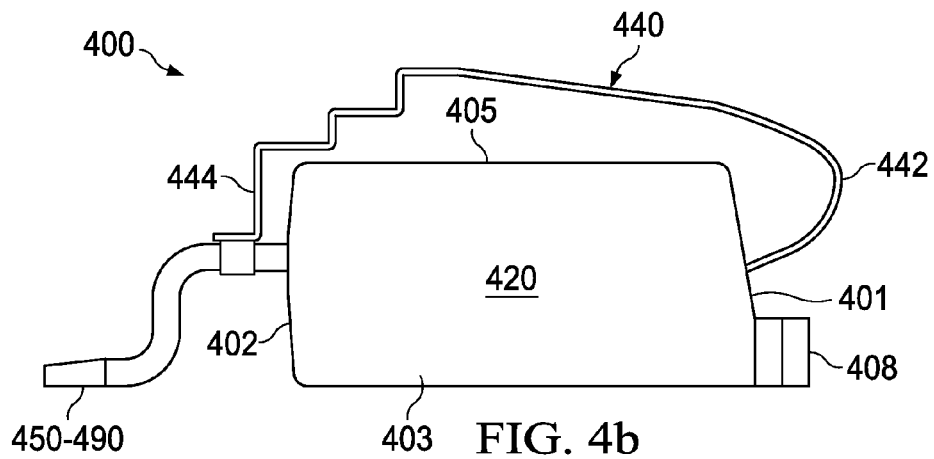
FIGS. 4b and 4e illustrate side views of an embodiment of the package with the releasable contact.
Figure 4C:
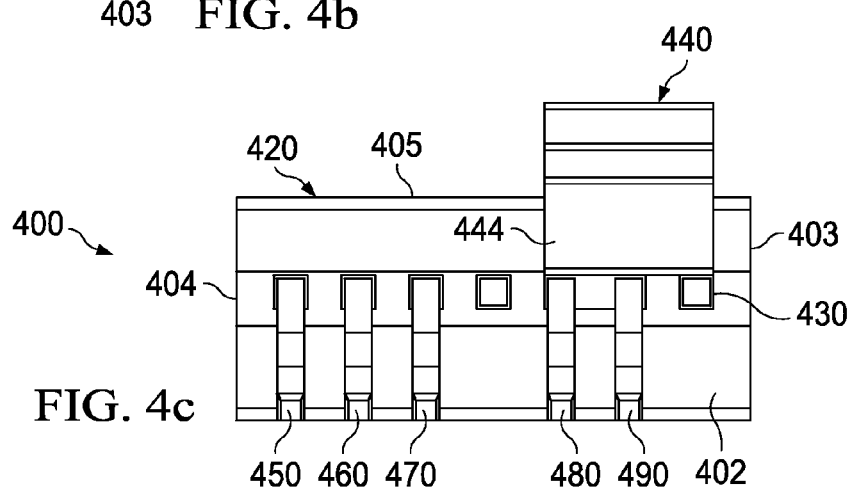
FIGS. 4c and 4f illustrate front views of an embodiment of the package with the releasable contact.
Figure 4D:
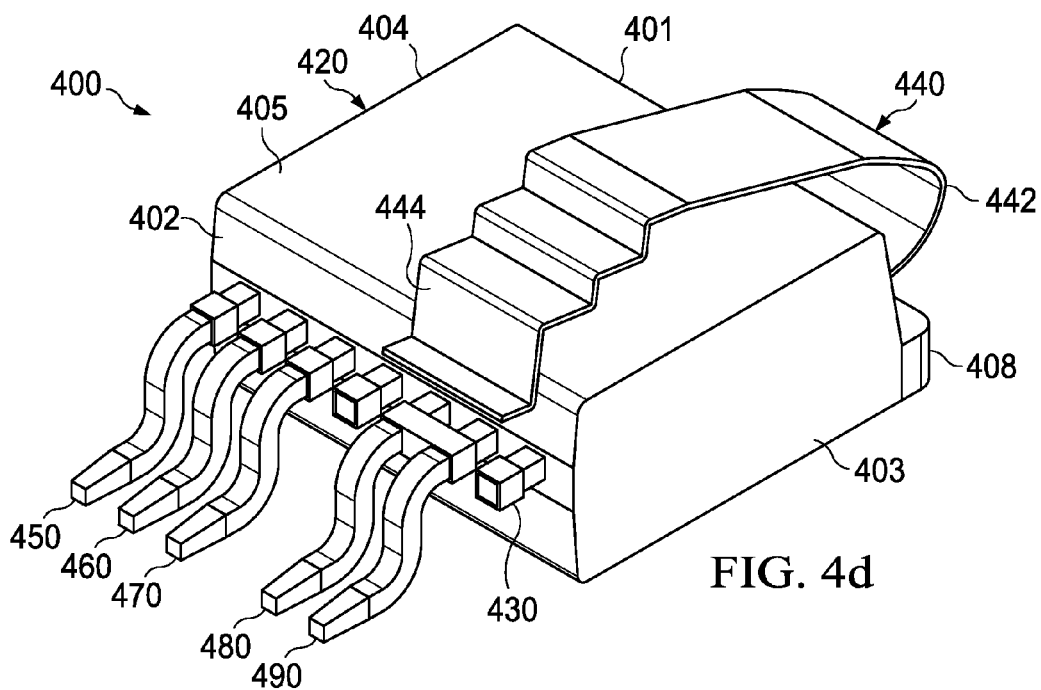
Figure 4E:
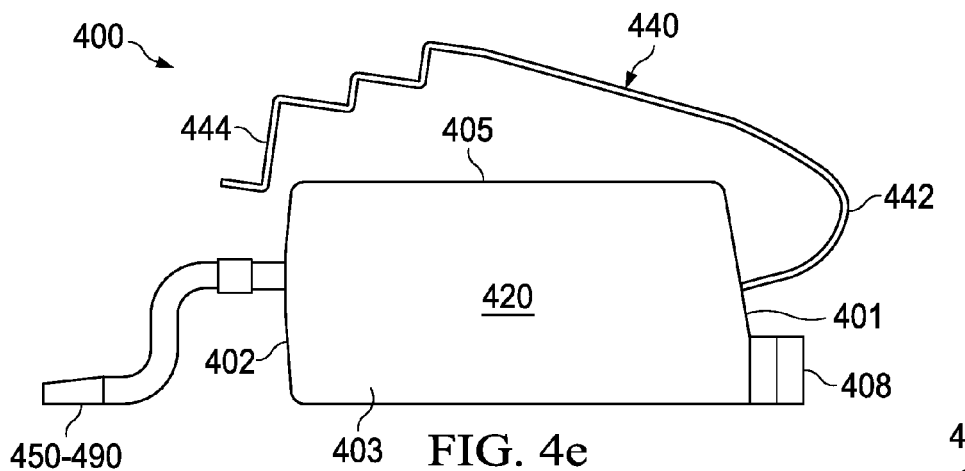
Figure 4F:
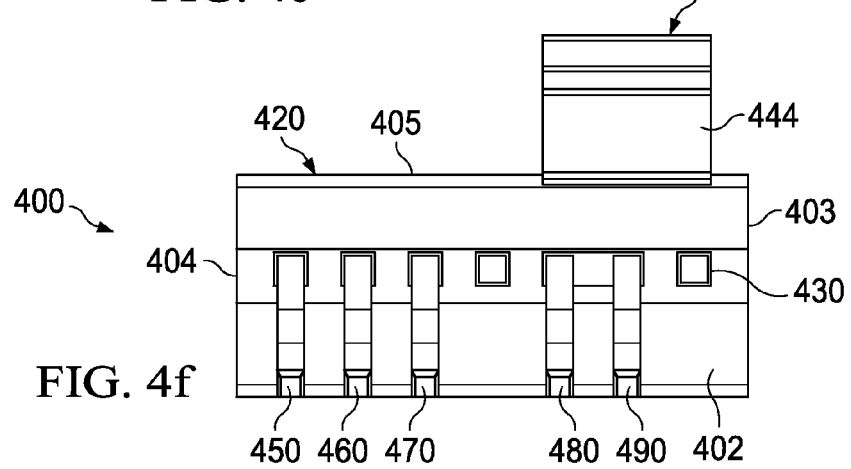

FIGS. 4a-4f show a further embodiment of a package 400. FIGS. 4a-4c show the package 400 with a releasable contact in closed position and FIGS. 4d-4f show the package 400 with the releasable contact in an open position.

The package 400 comprises an encapsulant 420. The encapsulant 420 may be a molding compound, a laminate or a casing. The encapsulant 420 may encapsulate the chip carrier and the chip disposed thereon. The encapsulant 420 may encapsulate the wires and/or the conductive clips. The encapsulant 420 may comprise the same materials as discussed with respect to the embodiment of FIG. 2.

The package 400 comprises side surfaces 401-404. The package further comprises a top surface 405, leads 450-490, an I/O contact 408 and a pin 430. The leads 450-490 and the pin 430 are disposed on the first side surface 401 of the package 400. The leads 450-490 and the pin 430 are protruding out from the encapsulant 420. The pin 430, the leads 450-490 and the I/O contact 408 may comprise a metal such as copper.

The package 400 further comprises a releasable contact 440. The releasable contact 440 comprises a first portion 442 disposed on a first side surface 401 of the package 400 and a second portion 444 disposed on a second side surface 402 of the package 400. The releasable contact 440 may be disposed, arranged or guided over the top surface 405 of the package 400. The releasable contact 440 may over-bridge the top surface 405 of the package 400. The releasable contact 440 provides an electrical and mechanical connection between the pin 430 and the leads 480, 490. In this embodiment, the releasable contact 440 may not comprise leads but rather bridges the leads 480, 490 and the pin 430. The second portion 444 of the releasable contact 440 is connected through a connection material or bridge to the leads 480, 490 and the pin 430. The leads 450-490 are configured to be connected to a carrier such as a printed circuit board (not shown).

The releasable contact 440 is configured to be released, opened, or disconnected from the pin 430 under certain thermal conditions. The releasable contact 440 may be a pre-stressed strip, a pre-stressed metal, a compressed metal strip or a metal spring. Alternatively, the releasable contact 440 may be a bended material. For example, the releasable contact 440 may comprise a metal, a plastic or a combination of metal and plastic. In one particular example, the releasable contact 440 is a copper spring. In another example, the releasable contact 440 is plastic except for the area or bridge which connects the leads 480, 490 and the pin 430 which is metal. When released, the bridge of the releasable contact 440 may flip up or away from the encapsulant 420.

In one embodiment the bridge or connection material is configured to release the releasable contact 440 from the pin 430 and the leads 480 and 490 above a predetermined temperature. In one embodiment, the connection material comprises a solder material. The solder material may become molten at the predetermined temperature thereby releasing the releasable contact 440. The connection materials and the predetermined temperatures may be the same as described with respect to the embodiment of FIG. 2.

Figure 5A:
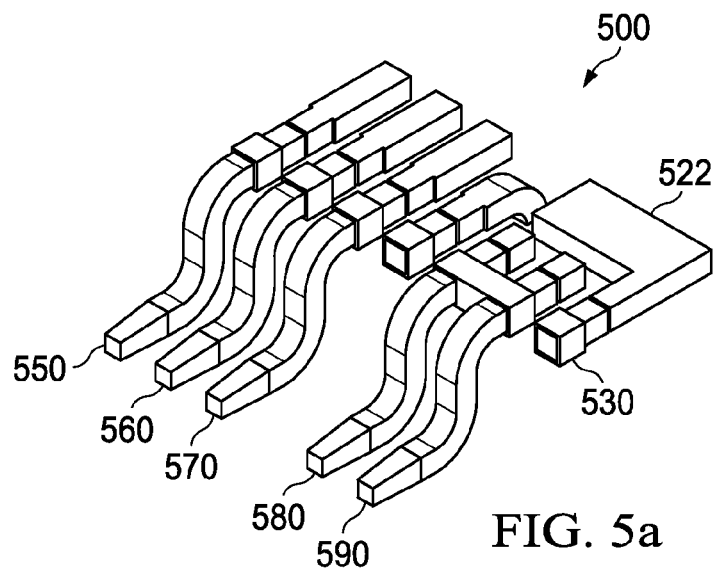
FIGS. 5a-5c illustrate an embodiment of a lead/pin arrangement.
Figure 5B:
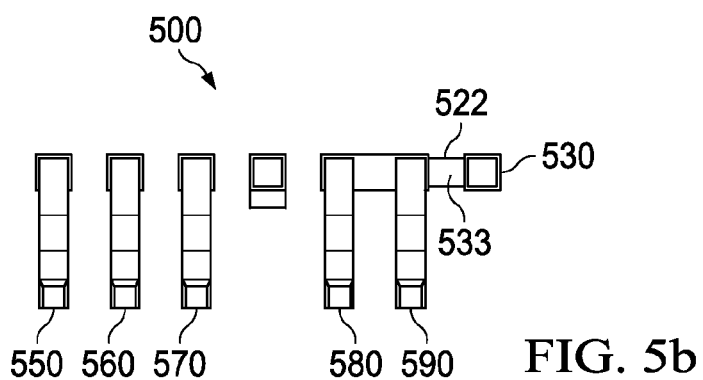
Figure 5C:
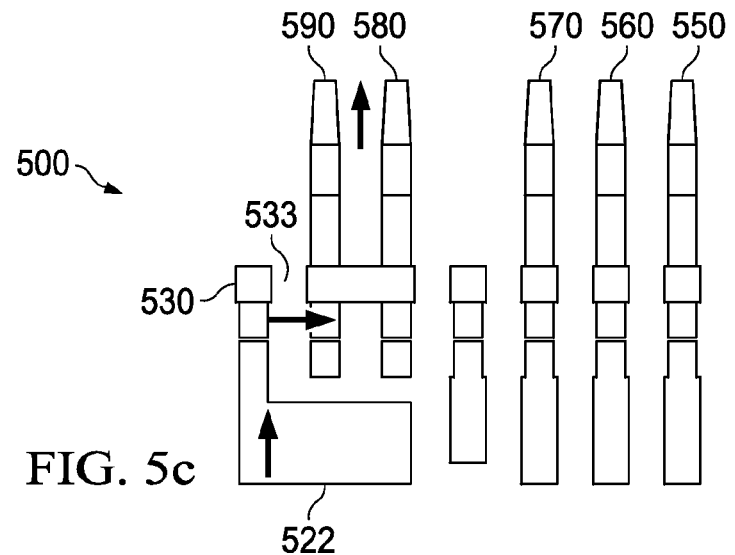

FIGS. 5a-5c show a lead layout or arrangement 500 of a package. The lead layout 500 may be the layout for the embodiment of package 400. The lead layout comprises first to fifth leads 550-590, and a pin 530. Leads 550-590 may be connected to a carrier such as a printed circuit board (PCB). Pin 530 is connected to pin extension 522 but pin 530 (through gap 533) and pin extension 522 are not connected to the lead 590. In one embodiment the pin extension 522 is connected (e.g., via wire bond) to the source of a first transistor (e.g., a power transistor). Alternatively, the pin extension 522 is connected to the drain of the first transistor. Pins 550-570 may be connected to a second transistor (e.g., a control transistor). The second transistor may control the first transistor.

FIG. 5c shows a current flow from the pin extension 522 to leads 580, 590 when the gap 533 is bridged by a releasable contact. If the releasable contact is closed current may flow from the power semiconductor chip through the releasable contact and the leads 580, 590 to the carrier. If the releasable contact is opened the current flow is interrupted.

Figure 6A:
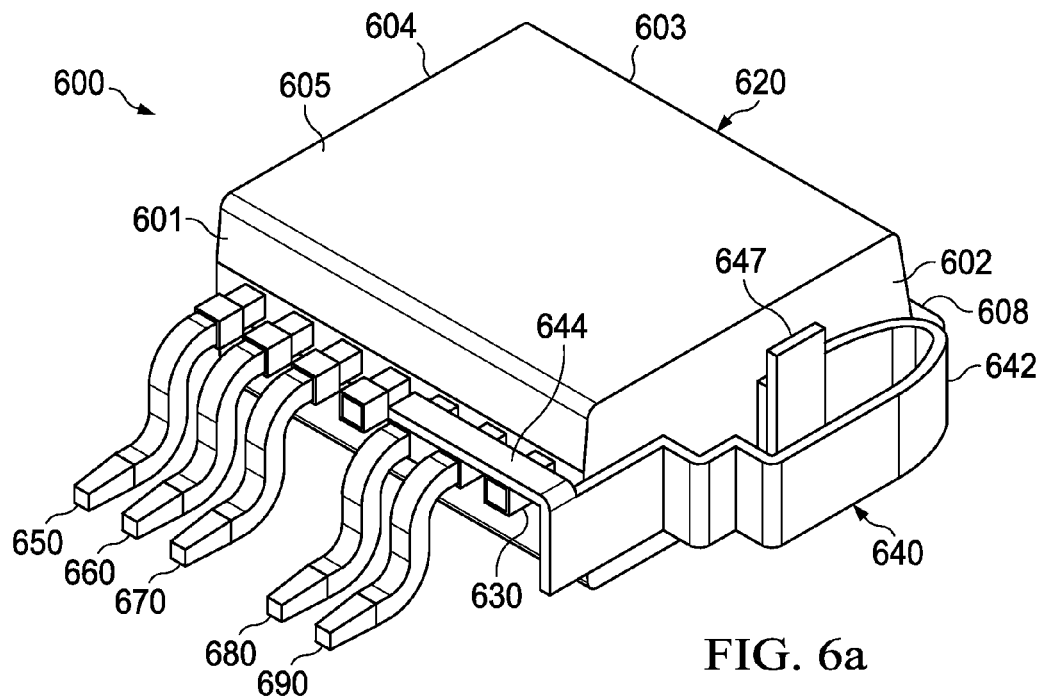
FIGS. 6a and 6d illustrate projection views of an embodiment of a package with a releasable contact.
Figure 6B:
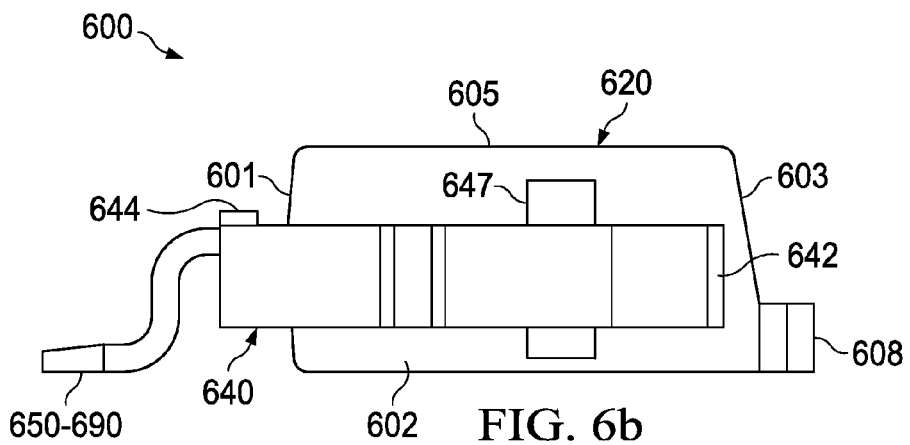
FIGS. 6b and 6e illustrate side views of an embodiment of the package with the releasable contact.
Figure 6C:
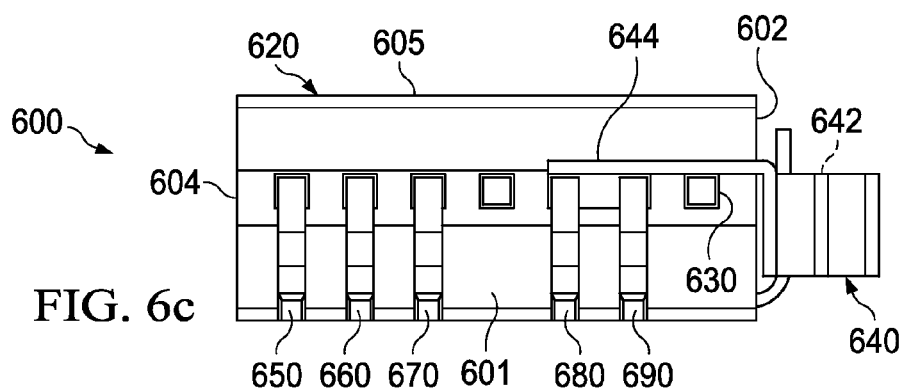
FIGS. 6c and 6f illustrate front views of an embodiment of the package with the releasable contact.
Figure 6D:
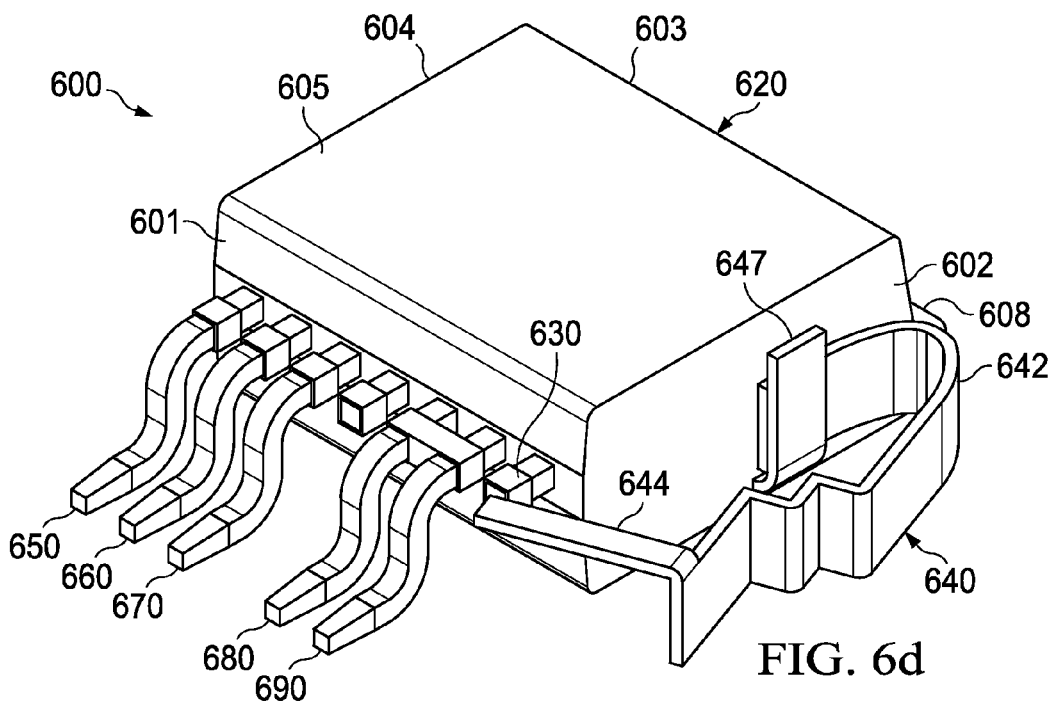
Figure 6E:
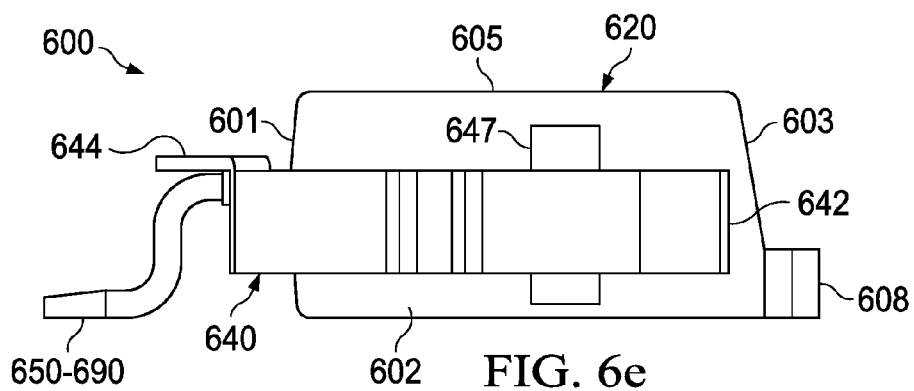
Figure 6F:
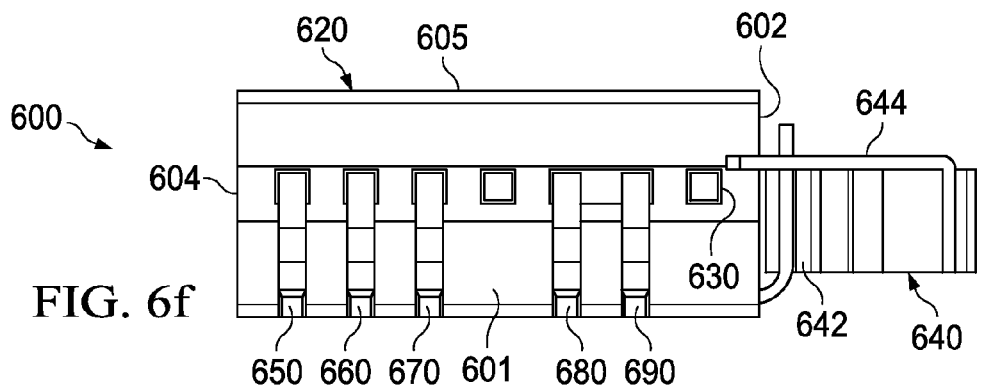

FIGS. 6a-6f show a further embodiment of a package 600. FIGS. 6a-6c show the package 600 with a releasable contact in closed position and FIGS. 6d-6f show the package 600 with the releasable contact in an open position.

The package 600 comprises an encapsulant. The encapsulant 620 may be a molding compound, a laminate or a casing. The encapsulant 620 may encapsulate the chip carrier and the chip disposed thereon. The encapsulant 620 may encapsulate the wires and/or the conductive clips. The encapsulant 620 may comprise the same materials as discussed with respect to the embodiment of FIG. 2.

The package 600 comprises side surfaces 601-604. The package further comprises a top surface 605, leads 650-690, an I/O contact 608 and a pin 630. The leads 650-690 and the pin 630 are disposed on the first side surface 601 of the package 600. The leads 650-690 and the pin 630 are protruding out from the encapsulant 620. The pin 630, the leads 650-690 and the I/O contact 608 may comprise a metal such as copper.

The package 600 further comprises a releasable contact 640. The releasable contact 640 comprises a first portion 644 disposed on a first side surface 601 of the package 600 and a second portion 644 disposed on a second side surface 602 of the package 600. The second portion 642 is fixed to the side surface 602 via a joint, hinge or pivot 647. The joint, hinge or pivot 647 may comprise an encapsulant material, a plastic material (different than the encapsulant material), metal or combinations thereof. The joint, hinge, or pivot may clip the releasable contact 640 to the side surface 602.

The releasable contact 640 may be disposed, arranged or guided along or over the side surfaces 601, 602 of the package 600. The releasable contact 640 may be arranged sideways from the package 600. The releasable contact 640 provides a mechanical and electrical connection between the pin 630 and the leads 680, 690. The releasable contact 640 may not comprise leads. The first portion 642 of the releasable contact 640 is connected through a connection material to or forms a bridge over the leads 680, 690 and the pin 630. The leads 650-690 are configured to be connected to a carrier such as a printed circuit board (not shown).

The releasable contact 640 is configured to be released, opened, or disconnected from the pin 630 under certain thermal conditions. The releasable contact 640 may be a pre-stressed strip, a pre-stressed metal, a compressed metal strip or a metal spring. Alternatively, the releasable contact 640 may be a bended material. For example, the releasable contact 640 may comprise a metal, a plastic or a combination of metal and plastic. In one particular example, the releasable contact 640 is a copper spring. In another example, the releasable contact 640 is plastic except for the bridge which connects the leads 680, 690 and the pin 630 which comprises a metal. When released, the bridge of the releasable contact 640 may flip sideways or away from the encapsulant 620.

In one embodiment the bridge or connection material is configured to release the releasable contact 640 from the pin 630 and the leads 680 and 690 above a predetermined temperature. In one embodiment, the connection material comprises a solder material. The solder material may become molten at the predetermined temperature thereby releasing the releasable contact 640. The solder materials and the predetermined temperatures may be the same as described with respect to the embodiment of FIG. 2.

Figure 7C:
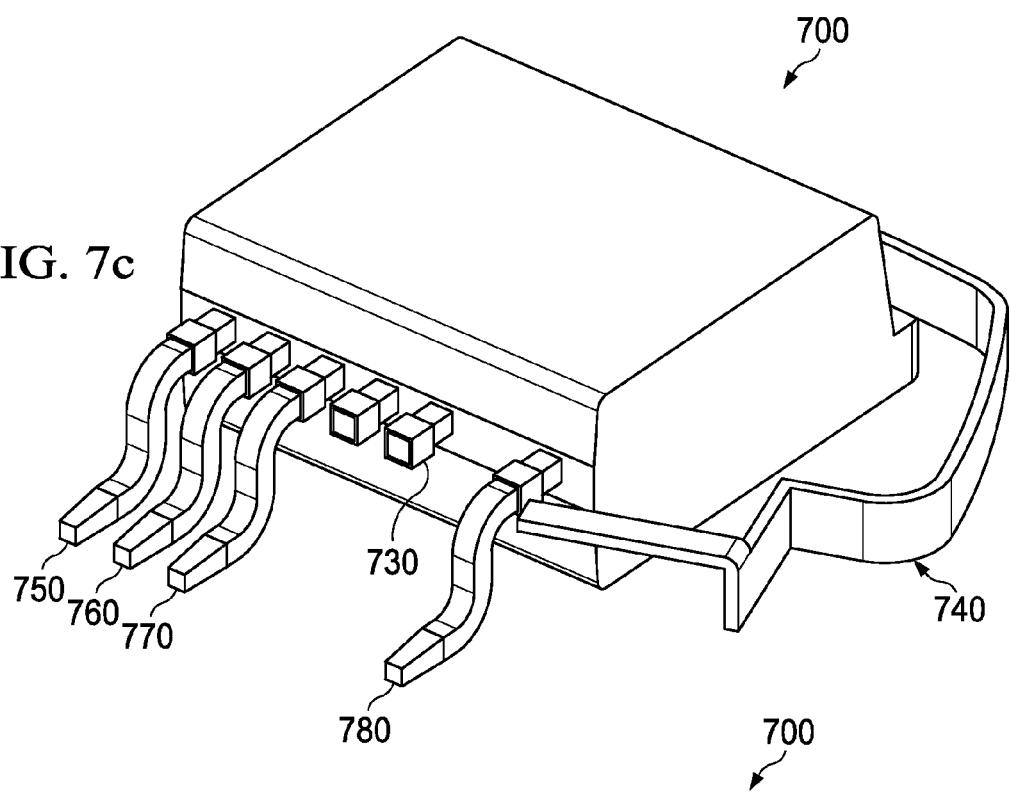
Figure 7D:
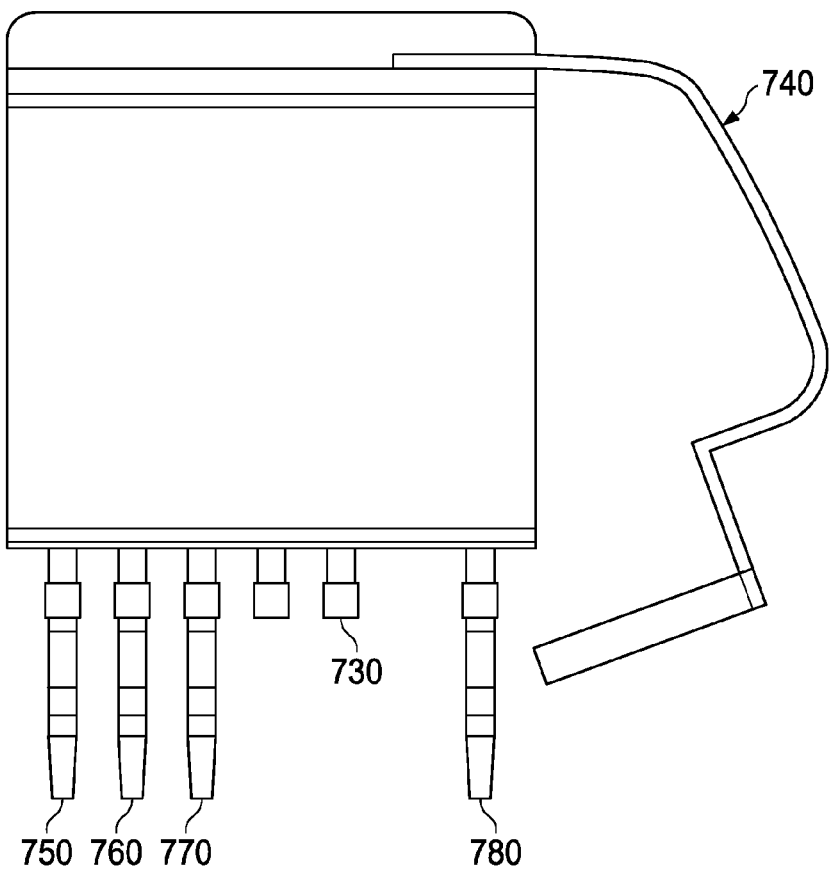

FIGS. 7a-7d show an embodiment of a package 700. FIGS. 7a and 7b show the package 700 with a closed releasable contact 740 and FIGS. 7c and 7d shows the package 700 with an open releasable contact 740. The elements of the package 700 are the same or similar as the elements of the package 600, except of those described further below.

In this embodiment, the package 700 comprises one lead 780 and a pin 730, electrically and mechanically connected through releasable contact 740. The package 700 may comprise one pin 730 or a plurality of pins such as pins 730 connected or bridged to the single lead 780 through the releasable contact 740. The embodiment of the package 700 may comprise any other combination of pins 730 and leads 750-770. For example, the package 700 may comprise only two leads 750, 760.

Figure 8A:
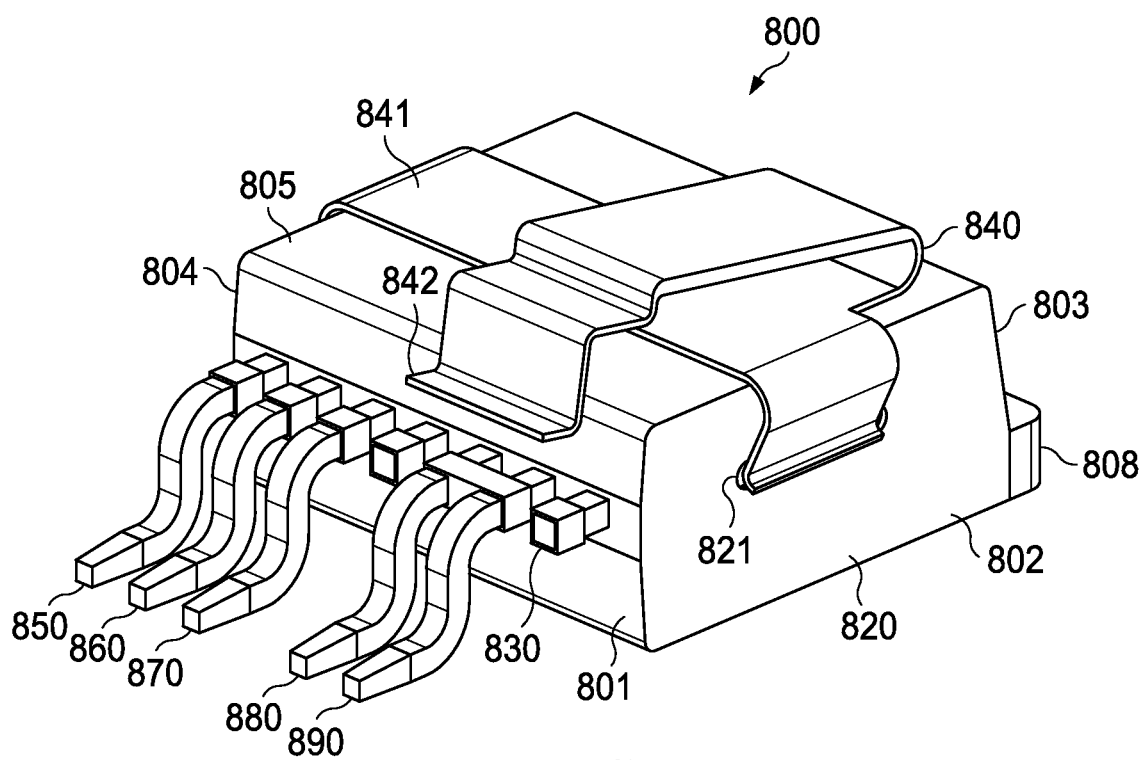
FIG. 8a-8c illustrate an embodiment of a package with a releasable contact.
Figure 8B:
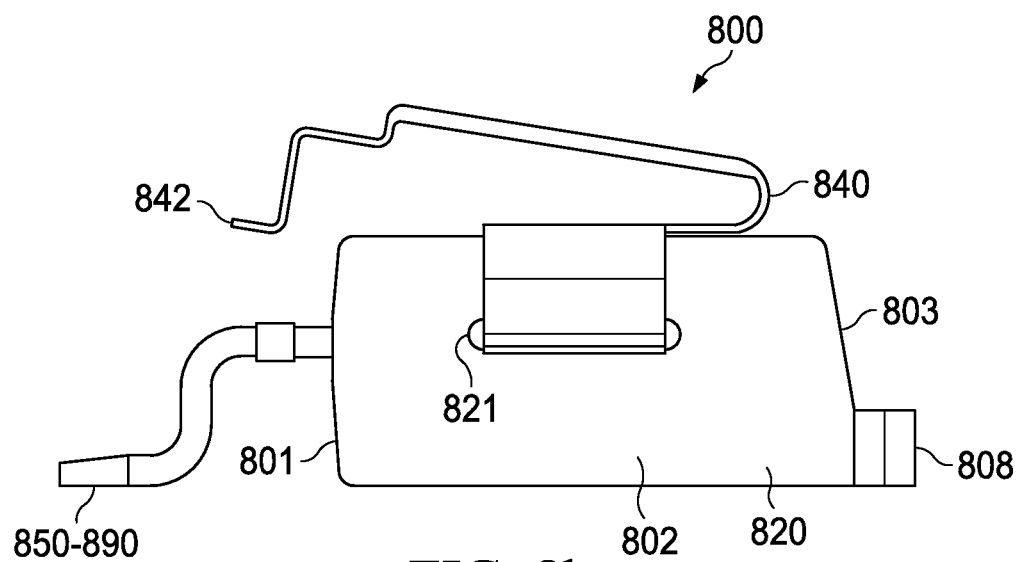
Figure 8C:
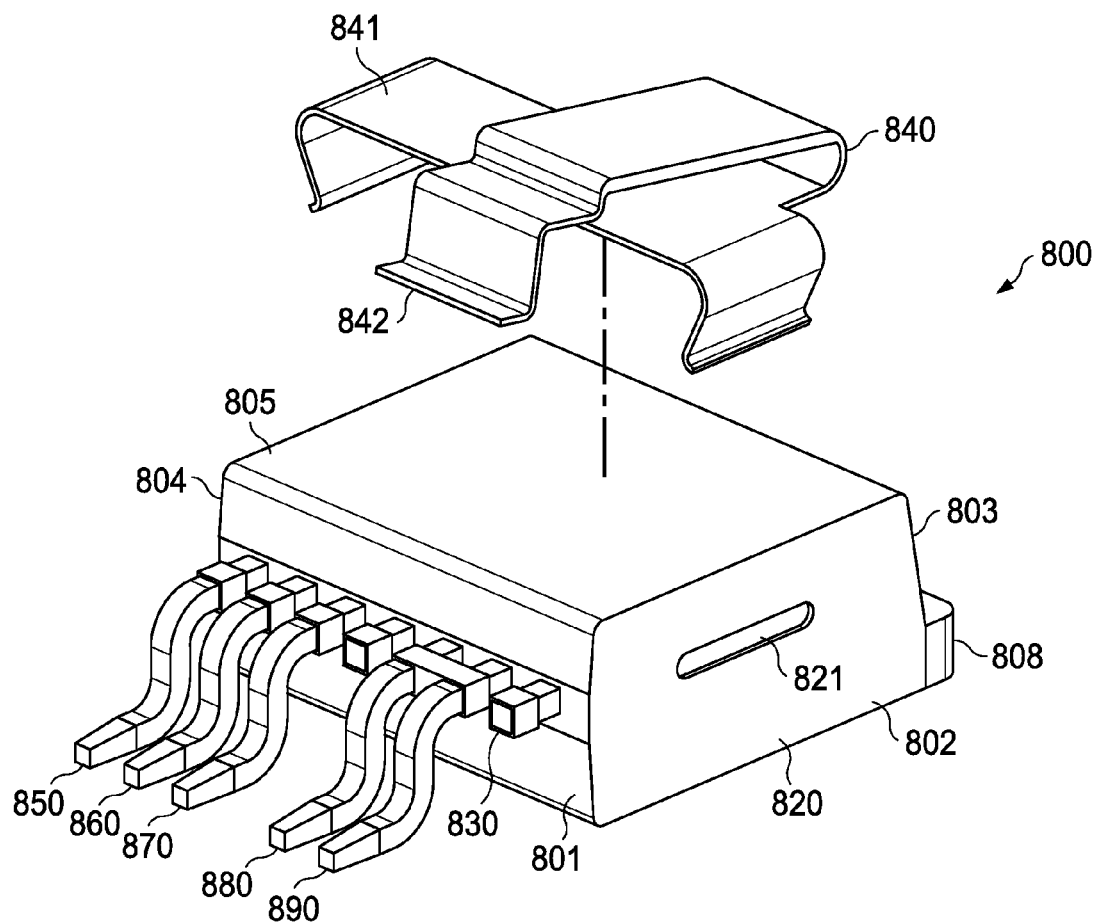

FIGS. 8a-8c show an embodiment of a package 800 with a releasable contact 840 in an open position.

The package 800 comprises a chip, a chip carrier and wires and/or conductive clips. The package 800 further comprising an encapsulant 820 encapsulating the chip, the chip carrier and/or the wires/conductive clips. The encapsulant 820 may be a molding compound, a laminate or a casing. The package 800 may comprise the same materials as discussed with respect to the embodiment of FIG. 2.

The package 800 comprises side surfaces 801-804. The package further comprises a top surface 805, leads 850-890, an I/O contact 808 and a pin 830. The leads 850-890 and the pin 830 are disposed on the first side surface 801 of the package 800 and protruding out from the encapsulant 820. The pin 830, the leads 850-890 and the I/O contact 808 may comprise a metal such as copper.

The package 800 further comprises a releasable contact 840. The releasable contact 840 is clipped into a groove or recess 821 in the second side surface 802 and the fourth side surface 804. The releasable contact 840 is disposed on, arranged on or overlies a central portion of the top surface 805. The releasable contact 840 may comprise a traversing portion 841 which is directly disposed on the top surface 805. A first portion 842 of the releasable contact 840 bridges or connects the leads 880, 890 and the pin 830. The releasable contact 840 may not comprise leads. The leads 850-890 are configured to be connected to a package carrier such as a printed circuit board (not shown).

The releasable contact 840 is configured to be released, opened, or disconnected from the pin 830 and the leads 880, 890 under certain thermal conditions. The releasable contact 840 may be a pre-stressed strip, a pre-stressed metal, a compressed metal strip or a metal spring. Alternatively, the releasable contact 840 may be a bended material. For example, the releasable contact 840 may comprise a metal, a plastic or a combination of metal and plastic. In one particular example, the releasable contact 840 is a copper spring. In another example, the releasable contact 840 is plastic except for the bridge 842 which connects the leads 880, 890 and the pin 830 which comprises a metal. When released, the bridge 842 of the releasable contact 840 may flip up or away from the encapsulant 820.

In one embodiment the connection material connecting the bridge 842, the pin 830 and the leads 880 and 890 is configured to be released above a predetermined temperature. In one embodiment, the connection material comprises a solder material. The solder material may become molten at the predetermined temperature thereby releasing the releasable contact 840. The connection material and the predetermined temperatures may be the same as described with respect to the embodiment of FIG. 2.

Figure 8D:
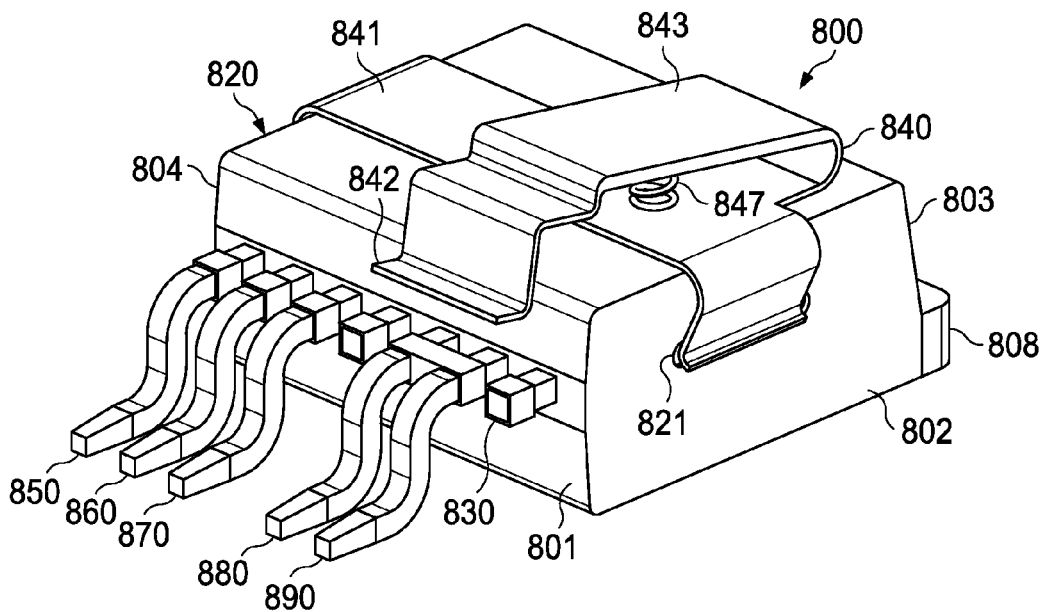
FIGS. 8d-8f illustrate an embodiment of a package with a releasable contact and a pushing mechanism.
Figure 8E:
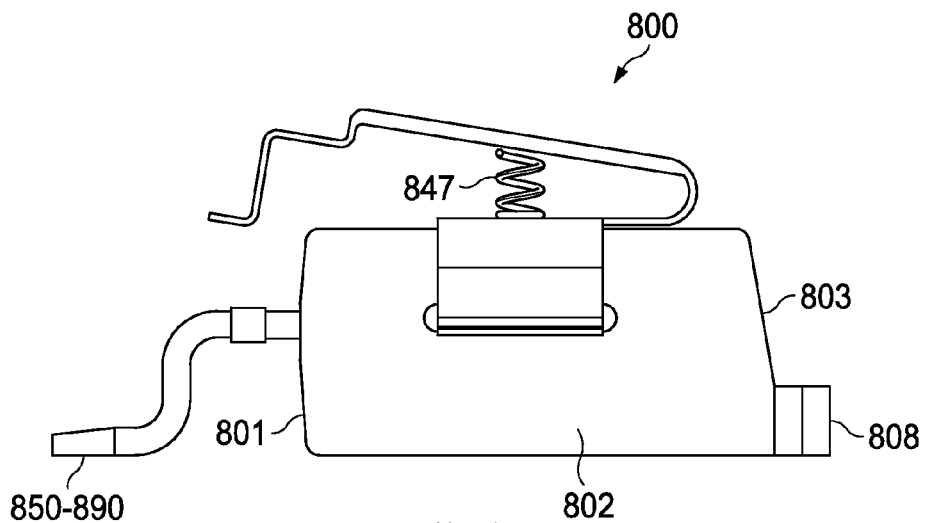
Figure 8F:
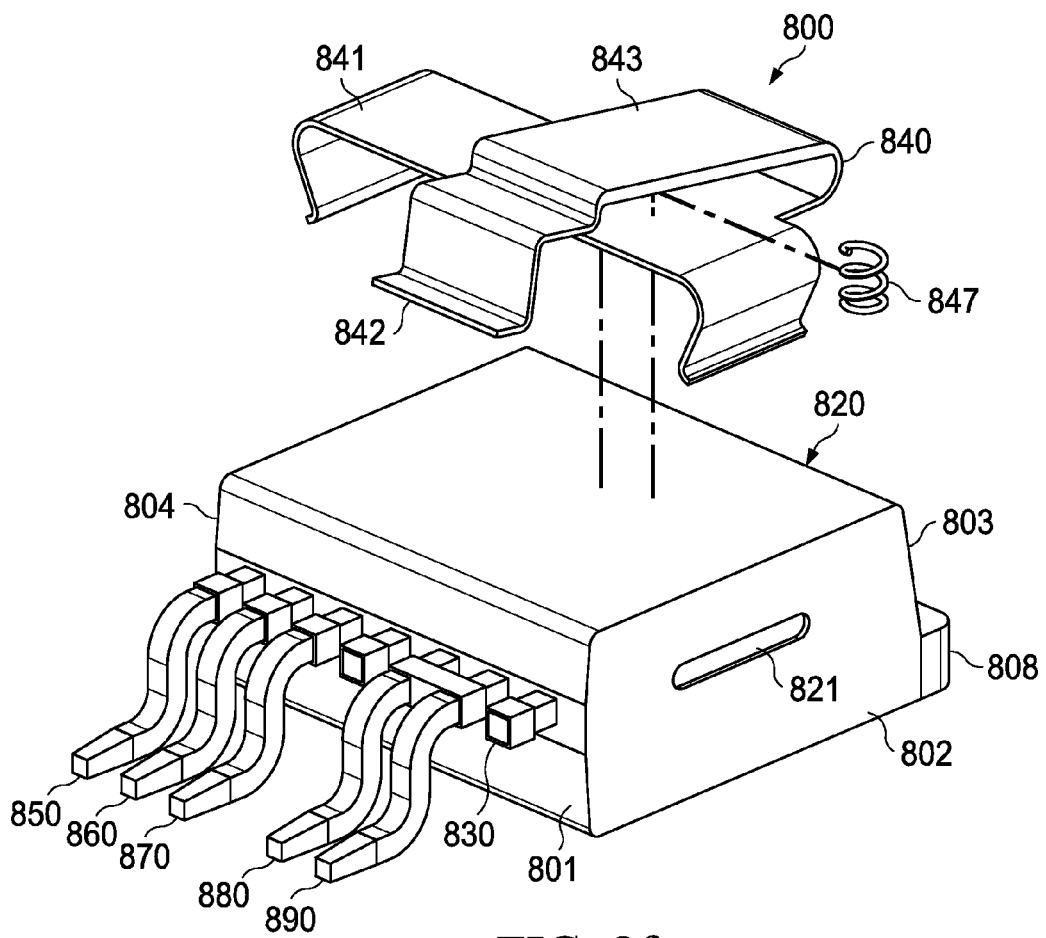

FIGS. 8d-8f show a further embodiment of the package 800. The elements of the package 800 in FIGS. 8d-8f are the same or similar as the elements of the package 800 in FIGS. 8a-8c except for the elements discussed below.

The package 800 of FIGS. 8d-8f further comprises a pushing mechanism 847 between the traversing portion 841 of the releasable contact 840 and the movable portion 843 of the releasable contact 840.

The releasable contact 840 is configured to be released, opened, or disconnected from the pin 830 and the leads 880, 890 under certain thermal conditions. The releasable contact 840 may be a bended material. For example, the releasable contact 840 may comprise a metal, a plastic or a combination of metal and plastic. The releasable contact 840 itself may or may not be pre-stressed or pre-compressed. In one embodiment the releasable contact 840 may be flipped up or moved away from the encapsulant 820 by the pushing mechanism 847 such as a spring. Alternatively, the releasable contact 840 may be flipped up or moved away from the encapsulant 820 by the pushing mechanism 847 and the compression or stress of the releasable contact 840 itself. The pushing mechanism 847 may be a pre-stressed metal or a metal spring such as a copper metal spring.

Figure 9A:
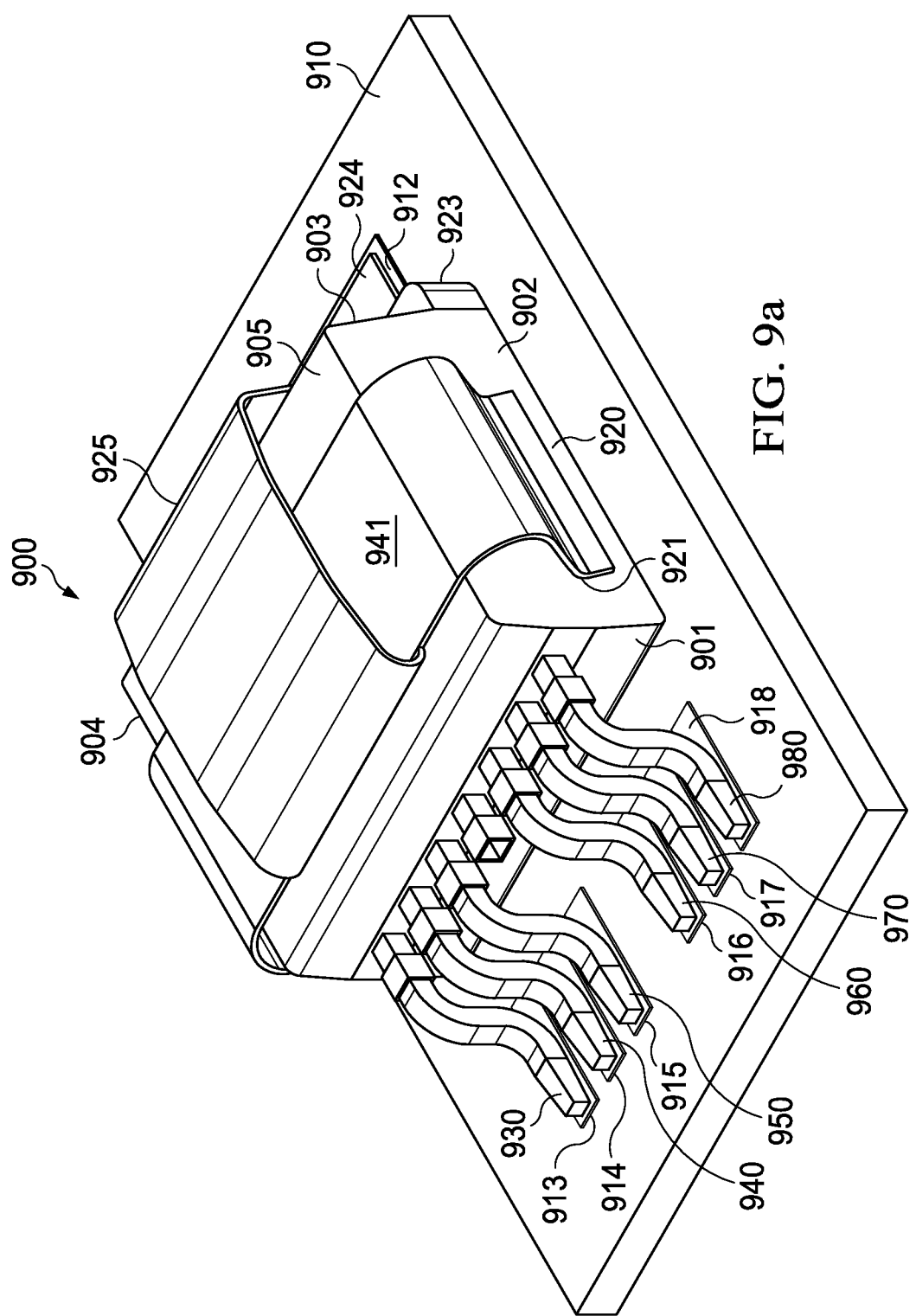
FIGS. 9a-9c illustrate an embodiment of a package with a releasable contact with a clip configuration.
Figure 9B:
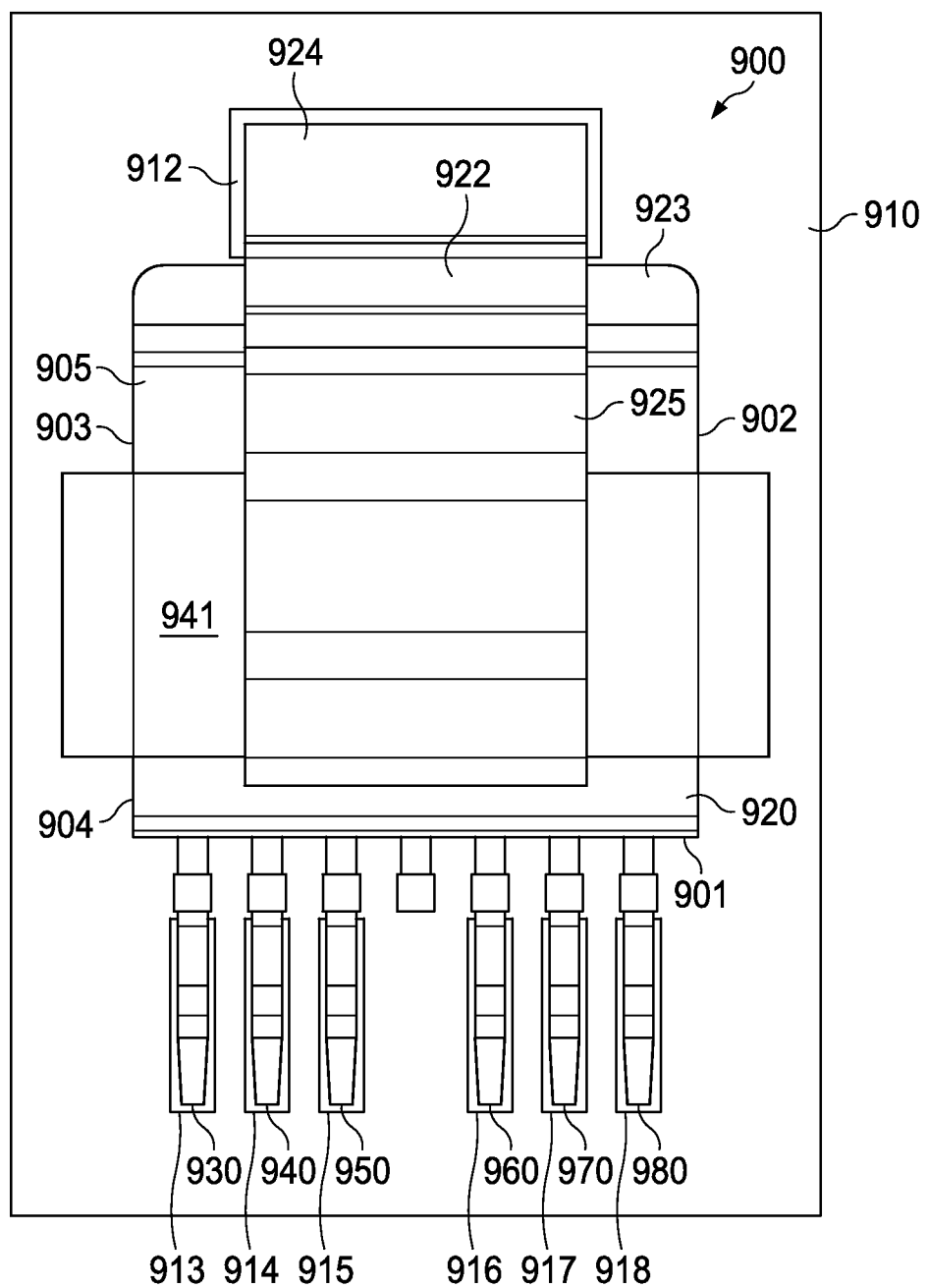
Figure 9C:
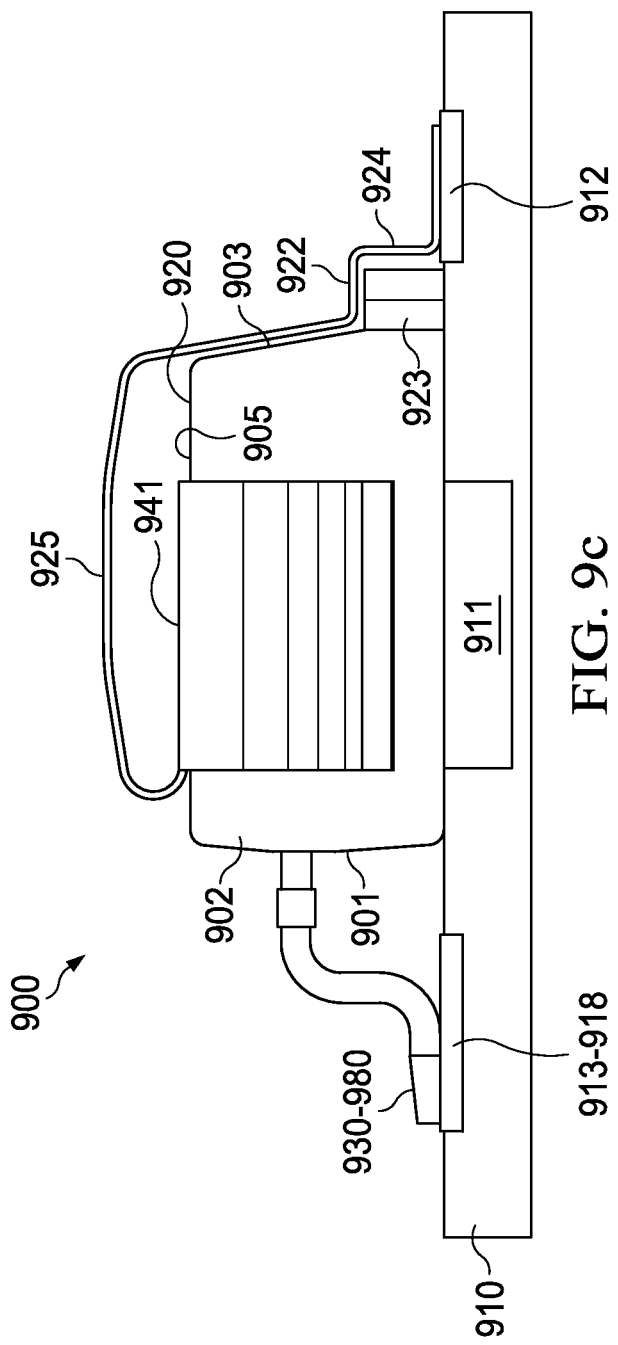

FIGS. 9a-9c show a further embodiment of a package 900 disposed on a package carrier 910. FIGS. 9a-9c show the package 900 with the releasable contact 925 in a closed position disposed on a package carrier 910.

The package 900 comprises a chip, a chip carrier and wires and/or conductive clips. The package further comprising an encapsulant 920 encapsulating the chip, the chip carrier and/or the wires/conductive clips. The encapsulant 920 may be a molding compound, a laminate or a casing. The package 900 may comprise the same materials as discussed with respect to the embodiment of FIG. 2.

The package 900 comprises side surfaces 901-904. The package 900 further comprises a top surface 905, an I/O contact 923 and leads 930-980. The leads 930-980 are disposed on the first side surface 901 of the package 900 and protruding out from the encapsulant 920. The leads 930-980 and the I/O contact 923 may comprise a metal such as copper.

The package 900 further comprises a releasable contact 925. The releasable contact 925 may be clipped into a groove or recess 921 in the second side surface 902 and the fourth side surface 904. Alternatively, the releasable contact 925 may be otherwise fixed to two side surfaces. The releasable contact 925 is disposed on, arranged on or overlies a central portion of the top surface 905. A traversing portion 941 of the releasable contact 925 may be directly disposed on the top surface 905. The releasable contact 925 may not comprise leads. A first portion 924 of the releasable contact 925 and the leads 930-980 are configured to be connected to the package carrier 910 (e.g. the printed circuit board).

In the embodiment of FIGS. 9a-9c the package 900 is disposed on the package carrier 910 such that the leads 930-980 are disposed on and connected to lead pads 913-918 of the package carrier 910 and that the releasable contact 925 is disposed on and connected to the pad 912.

The releasable contact 925 is released, opened, or disconnected from the pad 912 under certain thermal conditions. The releasable contact 925 may be a pre-stressed strip, a pre-stressed metal, a compressed metal strip or a metal spring. Alternatively, the releasable contact 925 may be a bended material. For example, the releasable contact 925 may comprise a metal, a plastic or a combination of metal and plastic. In one particular example, the releasable contact 925 is a copper spring. Alternatively, the releasable contact 925 is plastic except for a bridge portion 922 bridging the pad 912 with an I/O contact 923. The I/O contact 923 may be disposed adjacent but in a distant from the pad 912. The releasable contact 925 may connect the pad 912 of the package carrier 910 with the I/O contact 923 such that if a current is applied the current flows from the pad 912 through the releasable contact 925 (or bridge portion 922 of the releasable contact 925) to the I/O contact 923. When released, the releasable contact 925 may flip up or away from the encapsulant 920 disconnecting the I/O contact 923 and the pad 912.

In one embodiment the releasable contact 925 may be connected to the pad 912 and/or the contact 921 with a solder material. The solder material may become molten at a predetermined temperature thereby releasing the releasable contact 925 from the pad 912 and/or the contact 921. The solder materials and the predetermined temperatures may be the same as described with respect to the embodiment of FIG. 2.

In one embodiment the package 900 is disposed on a heat sink 911 in the package carrier 910. The pads 912, 913-918 and the heat sink 911 may comprise a metal such as copper or aluminum. The package carrier 910 may be a printed circuit board, a substrate, a laminate, a ceramic or a workpiece.

Figure 9D:
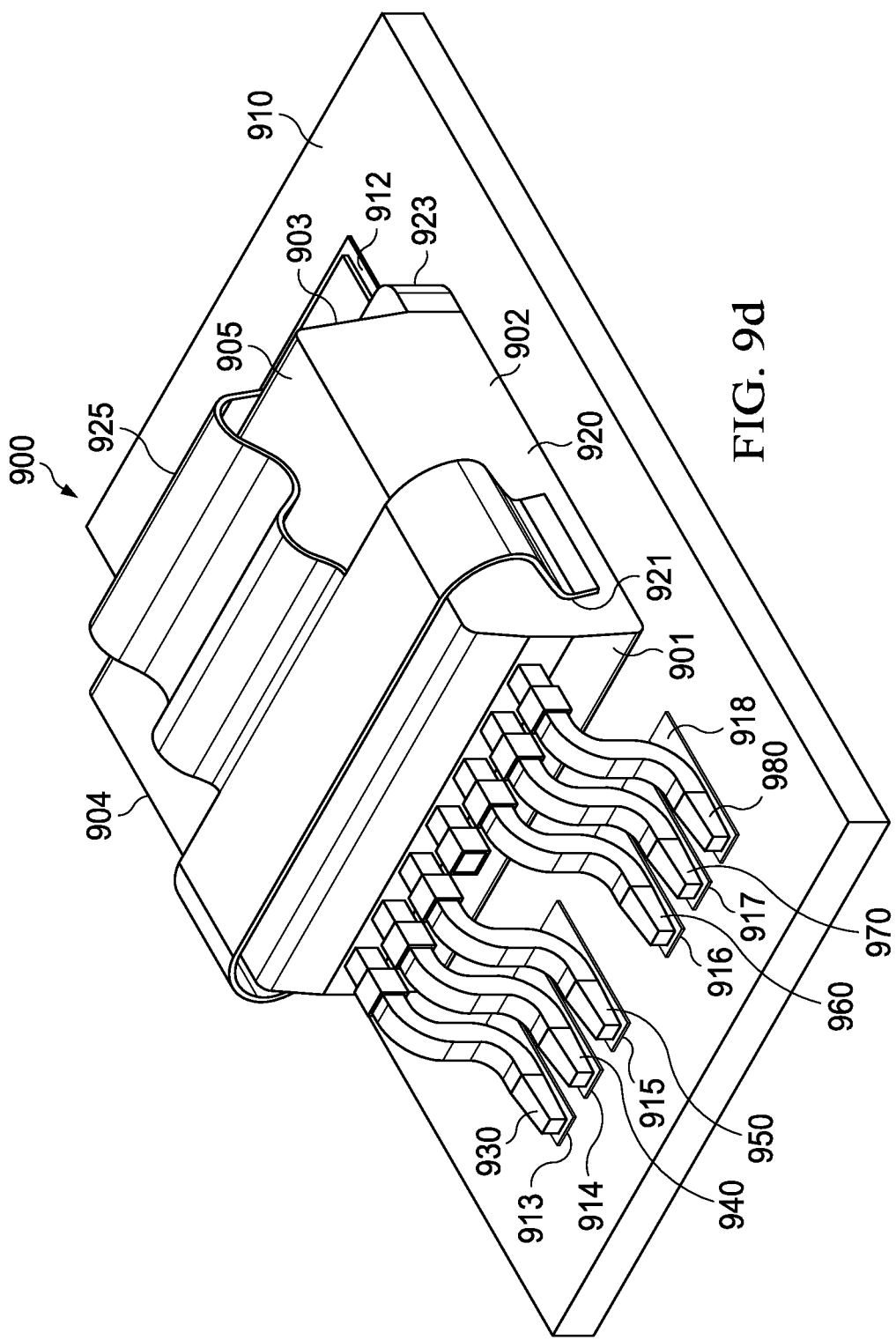
FIGS. 9d-9f illustrate another embodiment of a package with a releasable contact with a clip configuration.
Figure 9E:
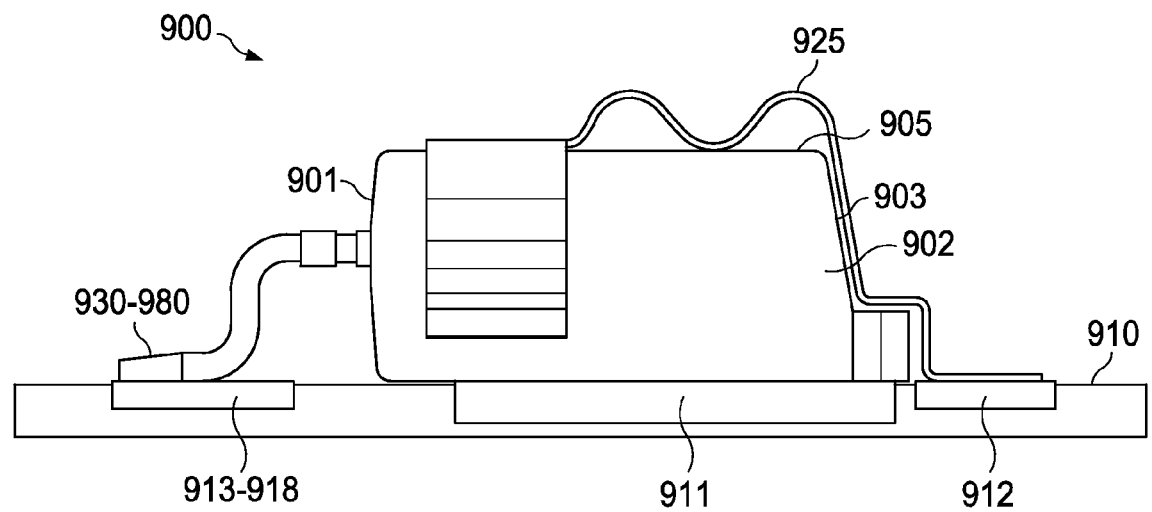
Figure 9F:
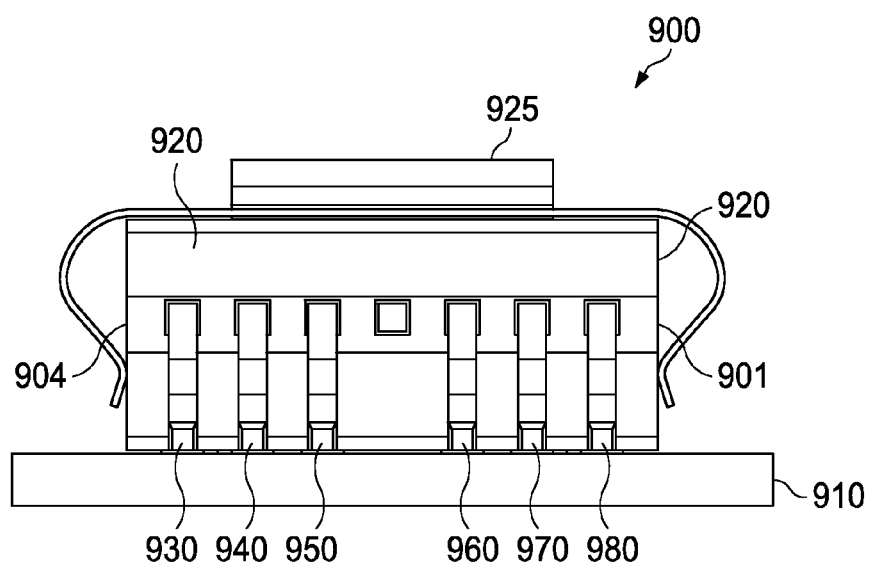

FIGS. 9d-9f show a further embodiment of the package 900. The elements of the package 900 in FIGS. 9d-9f are the same or similar as the elements of the package 900 in FIGS. 9a-9c except for the elements discussed below.

The package 900 of FIGS. 9d-9f comprises a wave shaped releasable contact 925. The wave shaped releasable contact 925 is configured to be released, opened, or disconnected from the pad 912 under certain thermal conditions. The wave-shaped releasable contact 925 may be a bended material. For example, the wave-shaped releasable contact 925 may comprise a metal, a plastic or a combination of a metal and a plastic. The wave shaped of the wave shape releasable contact 925 may provide the force to move the releasable contact away from the encapsulation 925 when released. In one embodiment the package 900 may further comprise an additional push mechanism to help the wave shaped releasable contact 925 to flip up or move up when released.

Figure 10A:
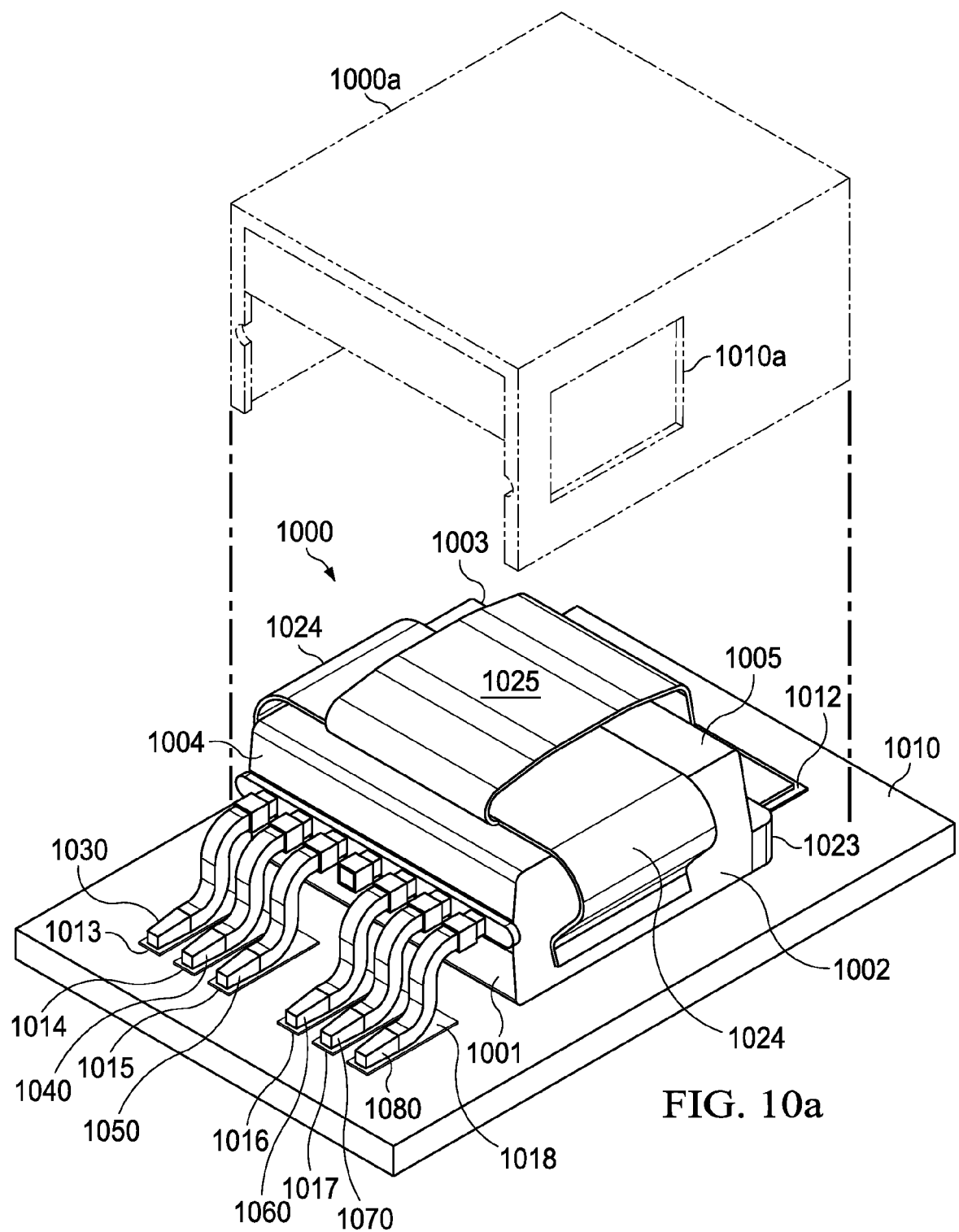
FIGS. 10a and 10b illustrate a package with a housing having openings in the sidewalls.
Figure 10B:
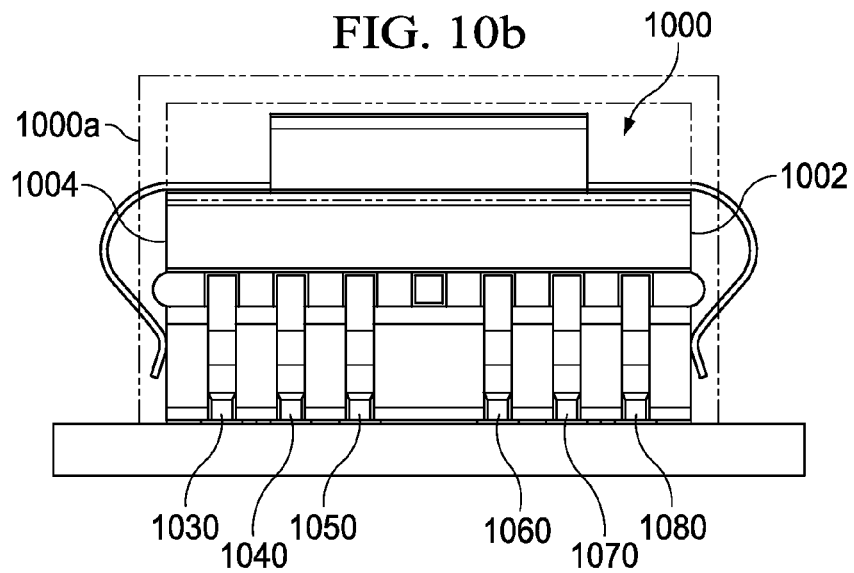
Figure 10C:
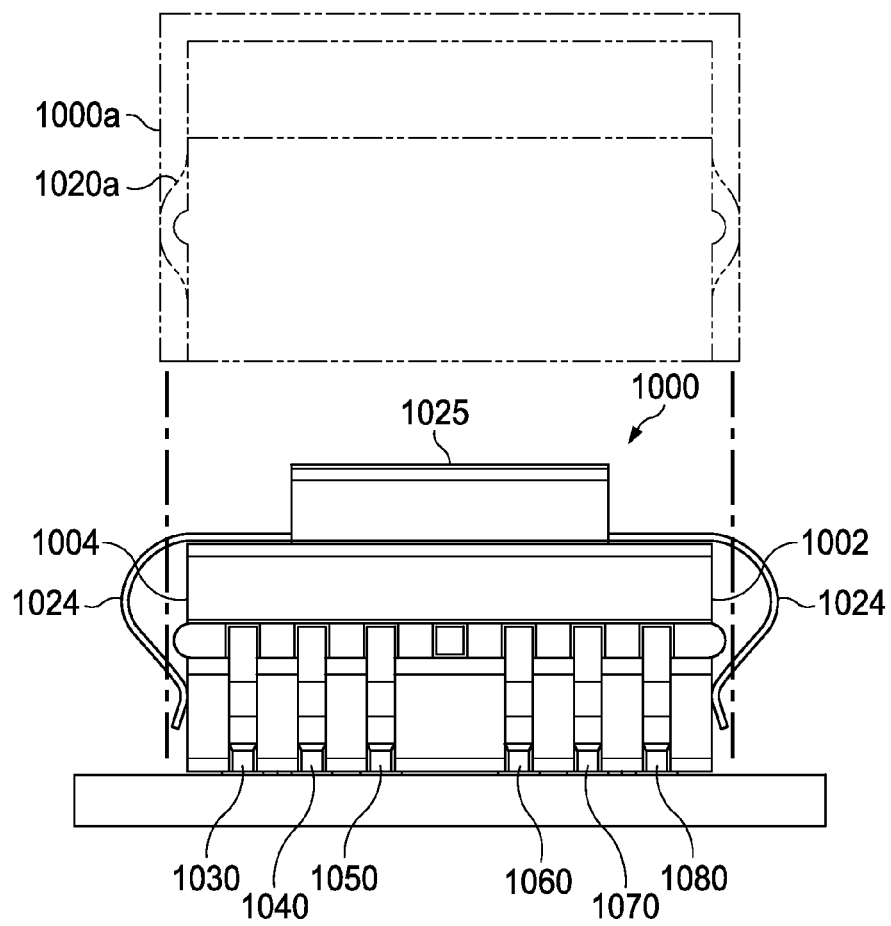
FIGS. 10c and 10d illustrate a package with a housing having grooves in the sidewalls.
Figure 10D:
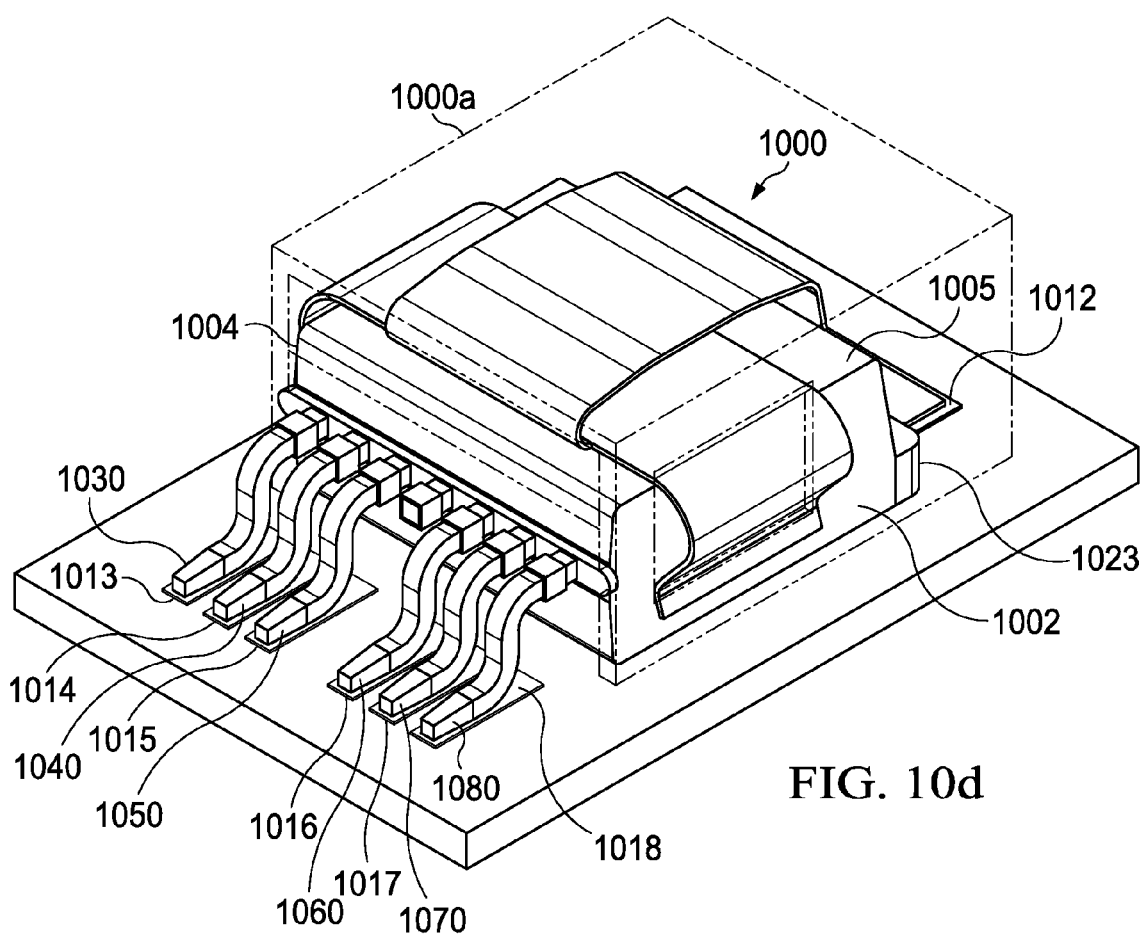

FIGS. 10a-10d show embodiments of a package 1000 disposed on a package carrier 1010 and covered by a housing 1000a. FIGS. 10a and 10b show a first embodiment having openings 1010a in the housing 1000a and FIGS. 10c and 10d show a second embodiment having grooves 1020a in the housing sidewalls. FIGS. 10a and 10c show the system before the housing 1000a is placed on the package 1000 and FIGS. 10b and 10d show the system after the housing 1000a is placed on the package 1000.

In one embodiment the package 1000 and the package carrier 1010 are the same or are similar as the package 900 and the package carrier 910 of FIGS. 9a-9c or of FIGS. 9d-9f. The package 1000 comprises leads 1030-1080 disposed on a first side 1001 and connected to the pads 1013-1018 of the package carrier. The package 1000 further comprises an I/O contact 1023 on a third side 1003 of the package 1000. The I/O contact 1023 may be disposed adjacent but in a distant from the pad 1012. The releasable contact 1025 may connect the pad 1012 of the package carrier 1010 with the I/O contact 1023 such that if a current is applied the current flows from the pad 1012 through the releasable contact 1025 (or bridge portion of the releasable contact 1025) to the I/O contact 1023. In one embodiment the releasable contact 1025 may be connected to the pad 1012 and/or the I/O contact 1023 with a solder material. The solder material may become molten at a predetermined temperature thereby releasing the releasable contact 1025 from the pad 1012 and/or the I/O contact 1023. The solder materials and the predetermined temperatures may be the same as described with respect to the embodiment of FIG. 2.

In other embodiments the package 1000 may comprise packages earlier described in embodiments of this invention.

In one embodiment the releasable contact 1025 comprises clips 1024. The clips 1024 may be placed in the openings 1010a of the housing 1000a. The clips 1024 may be connected to the package 1000 through a protruded mold protruding out in an upper part of the second and fourth side surfaces 1002, 1004. The protruded mold may prevent the releasable contact 1025 from slipping up when the housing 1000a is placed over the releasable contact 1025. The housing 1000a may be fixed or connected to the package 1000 through the clips 1024. The housing 1000a may be spring press fitted onto the package 1000 (and the on package carrier 1010). This is shown in FIGS. 10a and 10b. The housing 1010a may comprise plastic, a metal, or a combination of plastic and metal.

In one embodiment the clips 1024 may be placed in the grooves 1020a disposed in the sidewalls of the housing 1000a. The housing 1000a may be fixed or connected to the package 1000 via the clips 1024 locked into the grooves 1020a. The housing 1100 may be spring press fitted onto the package 1000 (and the package carrier 1010). This is shown in FIGS. 10c and 10d.

In one embodiment the housing 1000a is otherwise fixed to the package 1000 and the package carrier 1010. For example, the housing 1100a may be attached to the package carrier 1010 via an adhesive material or a clip.

Figure 11A:
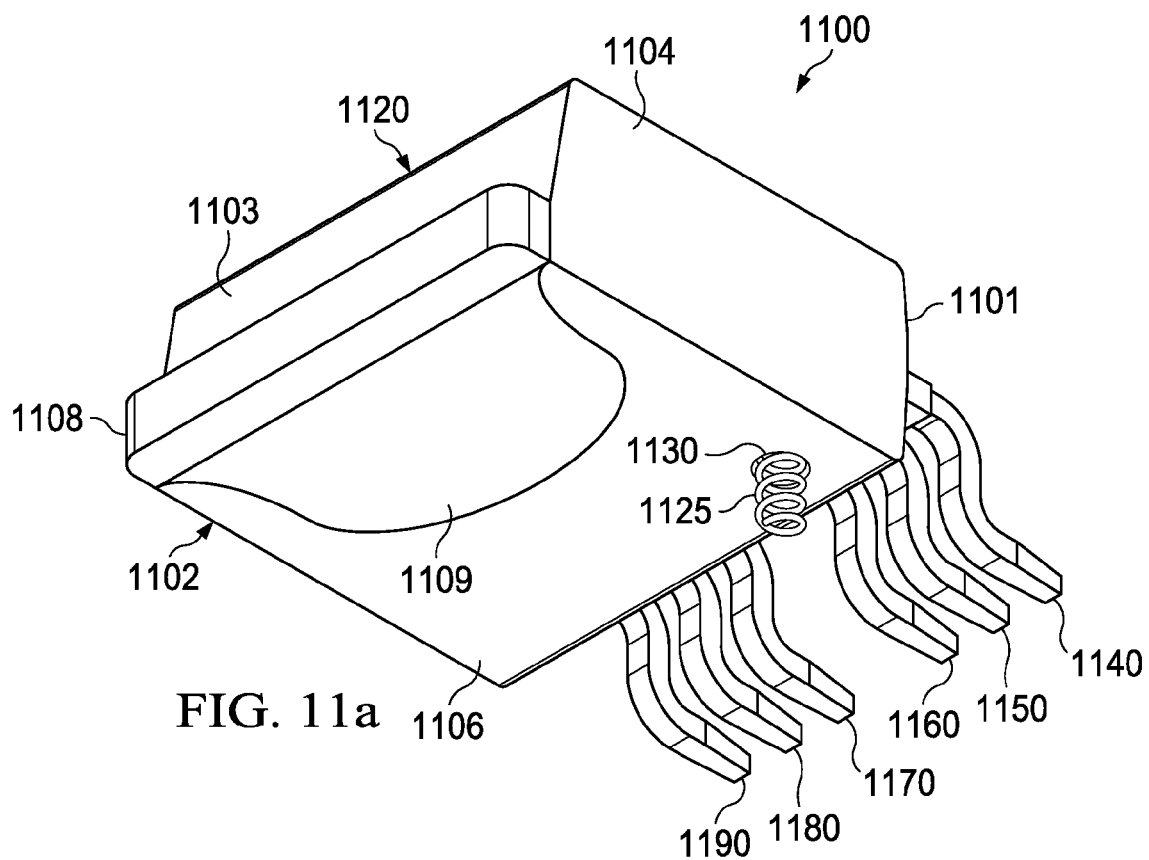
FIGS. 11a-11d illustrate an embodiment having fail open mechanism in the bottom surface.
Figure 11B:
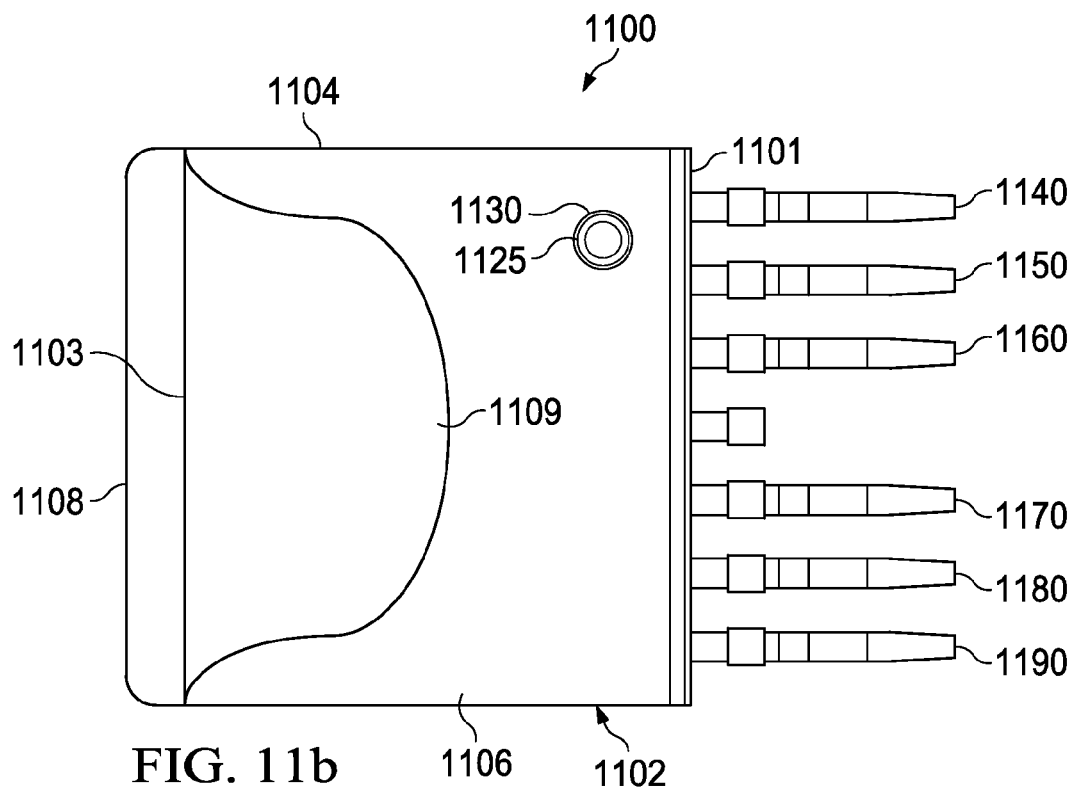
Figure 11C:
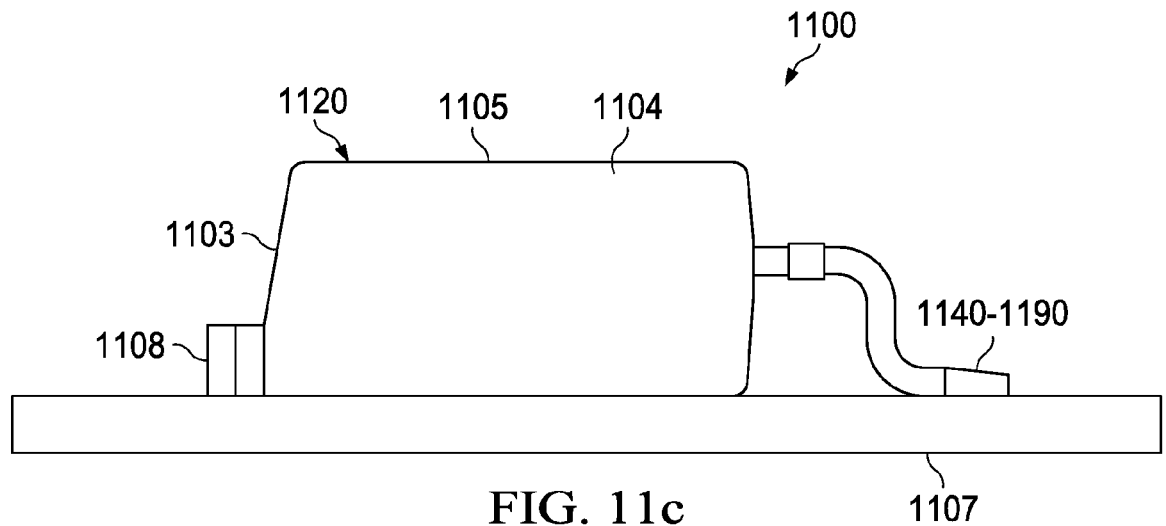
Figure 11D:
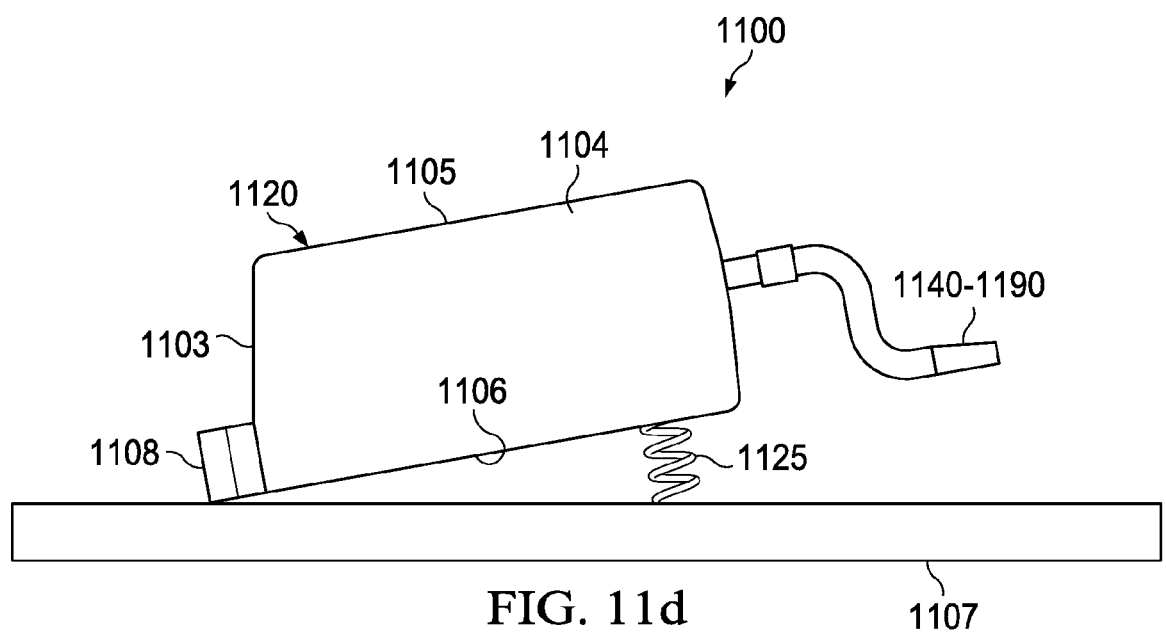

FIGS. 11a-11d show an embodiment of a package 1100. FIG. 11a shows a perspective view of an embodiment of the package 1100 and FIG. 11b shows a bottom view of an embodiment of the package 1100. Moreover, FIG. 11c shows a side view of an embodiment of the package 1100 with the a fail open mechanism in a closed position and FIG. 11d shows a side view of an embodiment of the package 1100 with the fail open mechanism in an open position.

The package 1100 comprises an encapsulant 1120. The encapsulant 1120 may be a molding compound, a laminate or a casing. The encapsulant 1120 may encapsulate the chip carrier and the chip disposed thereon. The encapsulant 1120 may encapsulate the wires and/or the conductive clips. The encapsulant 1120 may comprise the same materials as discussed with respect to the embodiment of FIG. 2.

The package 1100 comprises side surfaces 1101-1104. The package further comprises a top surface 1105, a bottom surface 1106, an I/O contact 1108 and leads 1140-1190. In one embodiment the I/O contact 1108 comprises an extension 1109. The extended I/O contact 1108/1109 may provide low ohmic resistance and good heat dissemination. The leads 1140-1190 are disposed on the first side surface 1101 of the package 1100. The leads 1140-1190 are protruding out from the encapsulant 1120.

The package 1100 further comprises a fail open mechanism 1125. The fail open mechanism 1125 may be disposed in the bottom surface 1106 of the package 1100. The fail open mechanism 1125 may be disposed in a hole 1130. In one embodiment, the package 1100 comprises a plurality of holes and a plurality of fail open mechanism 1125. For example, the package 1100 comprises two holes 1130 and two fail open mechanisms 1125. Alternatively, the package 1100 comprises one hole 1130 and two fail open mechanisms 1125.

The fail open mechanism 1125 is configured to be released or opened under certain thermal conditions. The fail open mechanism 1125 may comprise a pre-stressed metal, a compressed metal or a metal spring. Alternatively, the fail open mechanism 1125 may be a bended material. For example, the fail open mechanism 1125 may comprise a metal, a plastic or a combination of metal and plastic. In one particular example, the fail open mechanism 1125 is a copper spring soldered into the hole 1130.

In one embodiment the fail open mechanism 1125 is configured to be release above a predetermined temperature. Under normal operation conditions a holding material holds the fail open mechanism in the hole. If the package 1100 fails the fail open mechanism 1125 is opened and the leads 1140-1190 are disconnected from a package carrier 1107 such as a substrate or printed circuit board (FIG. 11d).

In one embodiment, the holding material may comprise a solder material which keeps the fail open mechanism 1125 in a compressed position. The solder material may become molten at the predetermined temperature thereby opening the fail open mechanism 1125. For example, the fail open mechanism 1125 is relaxed from its compressed position. The solder materials and the predetermined temperatures may be the same as described with respect to the embodiment of FIG. 2.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
an encapsulant encapsulating a chip;
a pin protruding from the encapsulant; and
a fail open mechanism disposed on the encapsulant and connected to the pin, wherein the fail open mechanism is configured to be disconnected from the pin when a temperature of the chip exceeds a pre-determined temperature.

2. The semiconductor package of claim 1, further comprising a lead protruding from the encapsulant, wherein the fail open mechanism is further connected to the lead and bridges the pin and the lead.

3. The semiconductor package of claim 1, wherein the fail open mechanism comprises a lead.

4. The semiconductor package of claim 1, wherein the fail open mechanism comprises a copper spring.

5. The semiconductor package of claim 1, wherein a first portion of the fail open mechanism is disposed on a first side of the encapsulant, wherein a second portion of the fail open mechanism is connected to the pin, and wherein the pin is disposed on a second side of the encapsulant.

6. The semiconductor package of claim 5, wherein the first side of the encapsulant and the second side of the encapsulant are opposite sides.

7. The semiconductor package of claim 5, wherein the first side of the encapsulant and the second side of the encapsulant are adjacent sides.

8. The semiconductor package of claim 1, wherein the fail open mechanism is guided above a top surface of the encapsulant.

9. The semiconductor package of claim 1, wherein the fail open mechanism is guided along side surfaces of the encapsulant.

10. The semiconductor package of claim 1, further comprising a plurality of leads protruding from the encapsulant, wherein the fail open mechanism is not connected to the plurality of leads.

11. The semiconductor package of claim 10, wherein the plurality of leads and the pin are disposed on the same side of the encapsulant.

12. A system comprising:
a carrier comprising a contact; and
a packaged chip disposed on the carrier, the packaged chip comprising an encapsulant and a fail open mechanism disposed on the encapsulant, wherein the fail open mechanism is connected to the contact, and wherein the fail open mechanism is configured to disconnect from the contact when a temperature of the packaged chip exceeds a pre-determined temperature.

13. The system of claim 12, wherein the fail open mechanism is a releasable lead.

14. The system of claim 12, wherein the packaged chip further comprises an I/O contact, wherein the I/O contact is connected to the fail open mechanism via a connection material, and wherein the connection material is configured to liquidate or become molten when a temperature exceeds the pre-determined temperature.

15. The system of claim 14, wherein the pre-determined temperature is between about 260° C. and about 300° C.

16. The system of claim 14, wherein the pre-determined temperature is between about 180° C. and about 240° C.

17. The system of claim 12, wherein the packaged chip comprises a power semiconductor chip and a control chip disposed on the power semiconductor chip.

18. The system of claim 12, wherein the packaged chip further comprises a plurality of leads protruding from the encapsulant, wherein the fail open mechanism is not connected to the plurality of leads, and wherein the plurality of leads are connected to a plurality of contacts of the carrier.

19. The system of claim 18, wherein the packaged chip is disposed on the carrier between the contact and the plurality of contacts.

20. A semiconductor package comprising:
an encapsulant encapsulating a chip;
a first plurality of leads protruding from the encapsulant; and
a fail open mechanism disposed on the encapsulant and connected to the first plurality of leads, wherein the fail open mechanism is configured to be disconnected from the first plurality of leads when a temperature exceeds a pre-determined temperature.

21. The semiconductor package of claim 20, further comprising a second plurality of leads protruding from the encapsulant, wherein the fail open mechanism does not connect to the second plurality of leads.

22. The semiconductor package of claim 21, wherein the first plurality of leads and the second plurality of leads are disposed on the same side of the encapsulant.

23. A semiconductor package comprising:
an encapsulant encapsulating a chip;
an I/O contact disposed on a surface of the encapsulant; and
a fail open mechanism disposed on the encapsulant, wherein the I/O contact is connected to the fail open mechanism via a connection material, and wherein the connection material is configured to be disconnected when a temperature of the chip exceeds a pre-determined temperature.

24. The semiconductor package of claim 23, further comprising a plurality of leads protruding from the encapsulant, wherein the plurality of leads are disposed on an opposite surface to the I/O contact, and wherein the fail open mechanism is not connected to the plurality of leads.

* * * * *

UNITED STATES PATENT AND TRADEMARK OFFICE
CERTIFICATE OF CORRECTION

| | | |
|---|---|---|
| PATENT NO. | : 9,082,737 B2 | Page 1 of 1 |
| APPLICATION NO. | : 13/678421 | |
| DATED | : July 14, 2015 | |
| INVENTOR(S) | : Carlo Baterna Marbella | |

It is certified that error appears in the above-identified patent and that said Letters Patent is hereby corrected as shown below:

Claims

In Col. 14, line 59, claim 20, following temperature, insert --of the chip--.
In Col. 15, line 8, claim 23, delete "of the chip".

Signed and Sealed this
Twenty-sixth Day of January, 2016

Michelle K. Lee
*Director of the United States Patent and Trademark Office*